US012682384B2

(12) United States Patent
Carr et al.

(10) Patent No.: US 12,682,384 B2
(45) Date of Patent: Jul. 14, 2026

(54) METHOD, COMPUTER-READABLE STORAGE MEDIUM, AND SYSTEM FOR PREDICTING OR ESTIMATING PHYSICAL ATTRIBUTES OF PRODUCTS SHOWN IN IMAGES

(71) Applicant: Arcade Studio, Inc., San Francisco, CA (US)

(72) Inventors: Andrew Carr, Springville, UT (US); Hakan Gunturkun, Palo Alto, CA (US); Sida Li, San Francisco, CA (US); Mariam Naficy, San Francisco, CA (US); Will Zhuk, San Francisco, CA (US)

(73) Assignee: ARCADE STUDIO, INC., San Francisco, CA (US)

( * ) Notice: Subject to any disclaimer, the term of this patent is extended or adjusted under 35 U.S.C. 154(b) by 0 days.

(21) Appl. No.: 19/218,202

(22) Filed: May 23, 2025

(65) Prior Publication Data

US 2026/0080450 A1 Mar. 19, 2026

Related U.S. Application Data

(60) Provisional application No. 63/696,365, filed on Sep. 18, 2024.

(51) Int. Cl.
*G06Q 30/00* (2023.01)
*G06F 30/10* (2020.01)
(Continued)

(52) U.S. Cl.
CPC ......... *G06Q 30/0621* (2013.01); *G06F 30/10* (2020.01); *G06F 30/12* (2020.01);
(Continued)

(58) Field of Classification Search
None
See application file for complete search history.

(56) References Cited

U.S. PATENT DOCUMENTS 8,174,539 B1 5/2012 Samaniego et al.
8,584,020 B2 11/2013 Kishore et al.
(Continued)

OTHER PUBLICATIONS

Umer, S., Mohanta, p. P., Rout, R.K. and Pandey, H.M., Machine learning method for cosmetic product recognition: a visual searching approach, 2021, Multimedia Tools and Applications, 80(28), pp. 34997-35023. (Year: 2021).*
(Continued)

*Primary Examiner* — Jeffrey A. Smith
*Assistant Examiner* — Brittany E Bargeon
(74) *Attorney, Agent, or Firm* — PERKINS COIE LLP; Alaberto Araiza; Anni Siitonen

(57) ABSTRACT

The disclosed technology includes a computer-implemented technique for predicting or estimating physical attributes of products depicted in images is disclosed. The method includes receiving one or more images—either photographs of real-world products or synthetic images generated from user-provided descriptions—processing the images using one or more machine learning (ML) models trained to detect and measure physical characteristics, and predicting or estimating measures such as volume, weight, and dimensions. The system can identify product categories, select appropriate ML models, and generate natural language descriptions of predicted attributes for user display. Training datasets may include both real and synthetic images with known attributes, and user feedback can be incorporated to improve model accuracy.

20 Claims, 14 Drawing Sheets

(51) Int. Cl.

| | |
|---|---|
| *G06F 30/12* | (2020.01) |
| *G06F 40/40* | (2020.01) |
| *G06Q 30/0601* | (2023.01) |
| *G06T 7/62* | (2017.01) |
| *G06T 11/60* | (2006.01) |

(52) U.S. Cl.

CPC ......... *G06F 40/40* (2020.01); *G06Q 30/0641* (2013.01); *G06T 7/62* (2017.01); *G06T 11/60* (2013.01); *G06T 2200/24* (2013.01)

(56) References Cited

U.S. PATENT DOCUMENTS

| | | | |
|---|---|---|---|
| 8,731,703 B1 | 5/2014 | Lehrer et al. | |
| 9,623,578 B1 | 4/2017 | Aminpour et al. | |
| 9,702,071 B2 | 7/2017 | Harvill | |
| 9,782,906 B1 | 10/2017 | Aminpour et al. | |
| 9,971,854 B1 | 5/2018 | Bowen | |
| 10,021,939 B2 | 7/2018 | Andon et al. | |
| 10,254,941 B2 | 4/2019 | Bowen | |
| 10,481,579 B1 | 11/2019 | Putman et al. | |
| 10,521,527 B2 | 12/2019 | Lester et al. | |
| 10,713,821 B1 | 7/2020 | Surya et al. | |
| 10,719,910 B2 | 7/2020 | Ho et al. | |
| 10,814,516 B1 | 10/2020 | Aminpour | |
| 10,853,839 B1 | 12/2020 | Galep et al. | |
| 10,929,904 B1 | 2/2021 | Jacobs, II et al. | |
| 10,943,286 B1 | 3/2021 | Ghosh et al. | |
| 11,030,574 B1 | 6/2021 | Grande et al. | |
| 11,263,460 B1* | 3/2022 | Rattner | G06N 3/084 |
| 11,301,925 B1 | 4/2022 | Marhel | |
| 11,574,421 B2* | 2/2023 | Koh | G06N 3/0464 |
| 11,640,485 B1 | 5/2023 | Seibold et al. | |
| 11,687,687 B1 | 6/2023 | Usui et al. | |
| 11,790,892 B1 | 10/2023 | Kessler | |
| 11,809,688 B1 | 11/2023 | Parasnis et al. | |
| 11,947,338 B1 | 4/2024 | Usui | |
| 12,026,736 B1 | 7/2024 | Maxwell et al. | |
| 12,125,264 B1 | 10/2024 | Park et al. | |
| 12,211,253 B1* | 1/2025 | Perla | G06V 10/40 |
| 12,367,015 B2 | 7/2025 | Roper et al. | |
| 2008/0140357 A1 | 6/2008 | Bussey et al. | |
| 2010/0162137 A1 | 6/2010 | Ganz et al. | |
| 2011/0205242 A1 | 8/2011 | Friesen | |
| 2011/0313878 A1 | 12/2011 | Norman | |
| 2012/0117072 A1* | 5/2012 | Gokturk | G06F 16/954 |
| | | | 707/E17.089 |
| 2012/0203371 A1 | 8/2012 | Hsu | |
| 2014/0143082 A1 | 5/2014 | Larson | |
| 2014/0277683 A1 | 9/2014 | Gupta et al. | |
| 2015/0055086 A1 | 2/2015 | Fonte | |
| 2015/0332479 A1 | 11/2015 | Gershon | |
| 2015/0366293 A1 | 12/2015 | Clarkson | |
| 2017/0220029 A1 | 8/2017 | Alun-Jones et al. | |
| 2017/0258164 A1 | 9/2017 | Barnet et al. | |
| 2017/0259445 A1 | 9/2017 | Aminpour | |
| 2017/0278000 A1 | 9/2017 | Kohlhepp | |
| 2018/0096496 A1 | 4/2018 | Lobaugh et al. | |
| 2018/0129188 A1 | 5/2018 | Jacobs, II | |
| 2018/0144243 A1 | 5/2018 | Hsieh et al. | |
| 2018/0247356 A1 | 8/2018 | Thompson | |
| 2018/0293632 A1 | 10/2018 | Golub et al. | |
| 2018/0349795 A1 | 12/2018 | Boyle et al. | |
| 2018/0373738 A1 | 12/2018 | Mitarai et al. | |
| 2019/0021426 A1 | 1/2019 | Barnes et al. | |
| 2019/0026394 A1 | 1/2019 | Barnes et al. | |
| 2019/0026397 A1 | 1/2019 | Barnes et al. | |
| 2019/0026407 A1 | 1/2019 | Barnes et al. | |
| 2019/0102815 A1 | 4/2019 | Norman | |
| 2019/0287189 A1 | 9/2019 | Oonishi et al. | |
| 2019/0362221 A1 | 11/2019 | Ando et al. | |
| 2019/0368085 A1 | 12/2019 | Morgan et al. | |
| 2020/0030880 A1 | 1/2020 | Nagahama et al. | |
| 2020/0042659 A1 | 2/2020 | Tallman et al. | |
| 2020/0103858 A1 | 4/2020 | Sayyarrodsari et al. | |

| | | | |
|---|---|---|---|
| 2020/0159870 A1 | 5/2020 | Bowen | |
| 2020/0159871 A1 | 5/2020 | Bowen | |
| 2020/0160612 A1 | 5/2020 | Bowen | |
| 2020/0184494 A1 | 6/2020 | Joseph et al. | |
| 2020/0192990 A1 | 6/2020 | Abad et al. | |
| 2020/0202045 A1 | 6/2020 | Mehr | |
| 2020/0242279 A1 | 7/2020 | Malkosh et al. | |
| 2020/0242733 A1 | 7/2020 | Kumar et al. | |
| 2020/0250894 A1 | 8/2020 | Mehr et al. | |
| 2020/0272129 A1 | 8/2020 | Crothers et al. | |
| 2020/0279008 A1 | 9/2020 | Jain et al. | |
| 2020/0293024 A1 | 9/2020 | Pail et al. | |
| 2020/0302099 A1 | 9/2020 | Grenier et al. | |
| 2020/0302100 A1 | 9/2020 | Teplinsky et al. | |
| 2020/0320228 A1 | 10/2020 | Lupas et al. | |
| 2020/0333772 A1 | 10/2020 | Srivastava et al. | |
| 2021/0042807 A1 | 2/2021 | Charraud | |
| 2021/0166472 A1 | 6/2021 | Han et al. | |
| 2021/0174603 A1 | 6/2021 | Han et al. | |
| 2021/0216674 A1 | 7/2021 | Hiller et al. | |
| 2021/0216809 A1 | 7/2021 | Kumar et al. | |
| 2021/0217135 A1* | 7/2021 | Kumar | G06N 3/0464 |
| 2021/0224432 A1 | 7/2021 | Grau et al. | |
| 2021/0233129 A1 | 7/2021 | Bikumala et al. | |
| 2021/0279377 A1 | 9/2021 | Kuniavsky | |
| 2021/0279381 A1 | 9/2021 | Bowen | |
| 2021/0286921 A1 | 9/2021 | Kuniavsky et al. | |
| 2021/0326312 A1 | 10/2021 | White | |
| 2021/0326494 A1 | 10/2021 | White | |
| 2021/0333986 A1 | 10/2021 | Lee et al. | |
| 2021/0357542 A1 | 11/2021 | Bowen et al. | |
| 2021/0374295 A1 | 12/2021 | Beck et al. | |
| 2021/0383031 A1 | 12/2021 | Wilcox | |
| 2021/0390450 A1 | 12/2021 | Slavov et al. | |
| 2021/0406994 A1 | 12/2021 | Lin | |
| 2022/0035966 A1 | 2/2022 | Mcminn et al. | |
| 2022/0035970 A1 | 2/2022 | Cheshire et al. | |
| 2022/0075845 A1 | 3/2022 | Bowen et al. | |
| 2022/0100917 A1 | 3/2022 | Mcgregor et al. | |
| 2022/0114639 A1 | 4/2022 | Christensen et al. | |
| 2022/0129958 A1 | 4/2022 | Kirwin et al. | |
| 2022/0129964 A1 | 4/2022 | Harvill | |
| 2022/0138383 A1 | 5/2022 | Malkosh et al. | |
| 2022/0164500 A1 | 5/2022 | Snow et al. | |
| 2022/0164607 A1* | 5/2022 | Almazan | G06F 18/2415 |
| 2022/0164835 A1 | 5/2022 | Koh | |
| 2022/0187847 A1 | 6/2022 | Cella et al. | |
| 2022/0197248 A1 | 6/2022 | Weinberg | |
| 2022/0198077 A1 | 6/2022 | Mora et al. | |
| 2022/0215145 A1 | 7/2022 | Krishnaswamy et al. | |
| 2022/0288858 A1 | 9/2022 | Norman | |
| 2022/0292587 A1 | 9/2022 | Wang et al. | |
| 2022/0398365 A1 | 12/2022 | Kumar et al. | |
| 2022/0405433 A1 | 12/2022 | Jost et al. | |
| 2022/0414530 A1 | 12/2022 | Cmielowski et al. | |
| 2023/0012650 A1 | 1/2023 | Aggarwal et al. | |
| 2023/0038240 A1 | 2/2023 | Wiley et al. | |
| 2023/0051783 A1 | 2/2023 | Sights et al. | |
| 2023/0084639 A1* | 3/2023 | Kettay | G06F 30/27 |
| | | | 33/494 |
| 2023/0106552 A1 | 4/2023 | Cohee et al. | |
| 2023/0116685 A1 | 4/2023 | Llamazares et al. | |
| 2023/0117766 A1 | 4/2023 | Yang et al. | |
| 2023/0142383 A1 | 5/2023 | Zhang et al. | |
| 2023/0177224 A1 | 6/2023 | Weiss et al. | |
| 2023/0177581 A1 | 6/2023 | Ren et al. | |
| 2023/0185425 A1 | 6/2023 | Delfino | |
| 2023/0185978 A1 | 6/2023 | Danon et al. | |
| 2023/0229976 A1 | 7/2023 | Cheng et al. | |
| 2023/0230030 A1* | 7/2023 | Gopalakrishnan | G06T 5/50 |
| | | | 705/28 |
| 2023/0232080 A1 | 7/2023 | Kim | |
| 2023/0264349 A1 | 8/2023 | Bourret et al. | |
| 2023/0273601 A1 | 8/2023 | Heindl et al. | |
| 2023/0281363 A1 | 9/2023 | Phan et al. | |
| 2023/0319585 A1 | 10/2023 | Zhang et al. | |
| 2023/0376639 A1 | 11/2023 | Lambourne | |
| 2023/0385467 A1 | 11/2023 | Harvill et al. | |
| 2024/0020430 A1 | 1/2024 | Harvill et al. | |

(56) References Cited

U.S. PATENT DOCUMENTS

| | | |
|---|---|---|
| 2024/0104275 A1 | 3/2024 | Liu et al. |
| 2024/0111404 A1 | 4/2024 | Harvill |
| 2024/0111913 A1 | 4/2024 | Harvill |
| 2024/0127517 A1 | 4/2024 | Rapport et al. |
| 2024/0203537 A1 | 6/2024 | Aguirre Vargas et al. |
| 2024/0242336 A1 | 7/2024 | Massey |
| 2024/0273265 A1 | 8/2024 | Kundu et al. |
| 2024/0296258 A1 | 9/2024 | Suto et al. |
| 2024/0303969 A1* | 9/2024 | Cuevas Juarez ....... G06V 20/60 |
| 2024/0338499 A1 | 10/2024 | Forrest et al. |
| 2024/0355050 A1 | 10/2024 | Couleaud et al. |
| 2024/0385584 A1 | 11/2024 | Vanbrocklin et al. |
| 2024/0386372 A1 | 11/2024 | Vanbrocklin et al. |
| 2024/0386511 A1 | 11/2024 | Vanbrocklin et al. |
| 2024/0394760 A1 | 11/2024 | Vanbrocklin et al. |
| 2024/0394808 A1 | 11/2024 | Vanbrocklin et al. |
| 2024/0403500 A1 | 12/2024 | Aoki |
| 2024/0403502 A1 | 12/2024 | Schmidt |
| 2024/0403773 A1 | 12/2024 | Pillalamarri et al. |
| 2024/0420205 A1 | 12/2024 | Unnikrishnan |
| 2024/0420216 A1 | 12/2024 | Stankiewicz et al. |
| 2024/0422205 A1 | 12/2024 | Beaver, III |
| 2025/0005810 A1 | 1/2025 | Sadalgi et al. |
| 2025/0014246 A1 | 1/2025 | Difonzo et al. |
| 2025/0029160 A1 | 1/2025 | Mukherjee et al. |
| 2025/0054278 A1 | 2/2025 | Araujo et al. |
| 2025/0061252 A1* | 2/2025 | Fitzmaurice ............ G06F 30/27 |
| 2025/0069298 A1* | 2/2025 | Srinivasan ......... G06Q 30/0643 |
| 2025/0086332 A1 | 3/2025 | Nehrkorn |
| 2025/0104117 A1 | 3/2025 | Raviv et al. |
| 2025/0111101 A1 | 4/2025 | Letzelter et al. |
| 2025/0111102 A1 | 4/2025 | Letzelter |
| 2025/0148137 A1 | 5/2025 | Mattson et al. |
| 2025/0148139 A1 | 5/2025 | Ferreira et al. |
| 2025/0148164 A1 | 5/2025 | King et al. |
| 2025/0148169 A1 | 5/2025 | Dupuis |
| 2025/0150494 A1 | 5/2025 | Piira et al. |
| 2025/0200387 A1 | 6/2025 | Zhao et al. |
| 2025/0200591 A1 | 6/2025 | Phillips et al. |
| 2025/0217484 A1 | 7/2025 | Pachisia et al. |
| 2025/0217871 A1 | 7/2025 | Hidaka |
| 2025/0245728 A1 | 7/2025 | Farrokhsiar et al. |
| 2025/0246013 A1 | 7/2025 | Yao |

OTHER PUBLICATIONS

Gewirtz, David, How I used ChatGPT and AI art tools to launch my Etsy business fast, May 4, 2023, https://www.zdnet.com/article/how-i-used-chatgpt-and-ai-art-tools-to-launch-my-etsy-business-fast.

Morleyspace, Morley Space: Purveyors of Fine Merch Since 2023, Etsy store front, May 5, 2023, https://web.archive.org/web/20230505025737/https://www.etsy.com/shop/MorleySpace.

* cited by examiner

200

202

|A modern engagement ring, dome shape with a single diam...    Use image    ✦ Dream

Click to try

204

( Enamel necklace with the word(s) )    ( Stud earrings in the shape of ... )

( A charm in the shape of... )    ( A dainty diamond ring with... )

$150    $582    $82    $110

What style(s)?

( Dainty )    ( Minimalist )    ( Bold )    ( Vintage )

206    208

METHOD, COMPUTER-READABLE STORAGE MEDIUM, AND SYSTEM FOR PREDICTING OR ESTIMATING PHYSICAL ATTRIBUTES OF PRODUCTS SHOWN IN IMAGES

CROSS-REFERENCE TO RELATED APPLICATION

This application claims priority to U.S. Provisional Ser. No. 63/696,365, titled "Artificial Intelligence-Driven Product Creation and Analysis Platform," filed Sep. 18, 2024, which is incorporated herein by reference in its entirety.

BACKGROUND

In the modern digital era, web-based storefronts have become the foremost medium for retail transactions. These online platforms provide an extensive selection of products, encompassing both everyday consumer goods and specialized items. The user experience on these platforms generally includes browsing through product categories, examining detailed product descriptions, and completing purchases via an efficient checkout process. Although these online stores offer convenience and accessibility, the user experience is often confined to choosing from preexisting products. This constraint can be limiting for users seeking more personalized and distinctive items.

BRIEF DESCRIPTION OF THE DRAWINGS

Detailed descriptions of implementations of the present invention will be described and explained through the use of the accompanying drawings.

Figure 1:
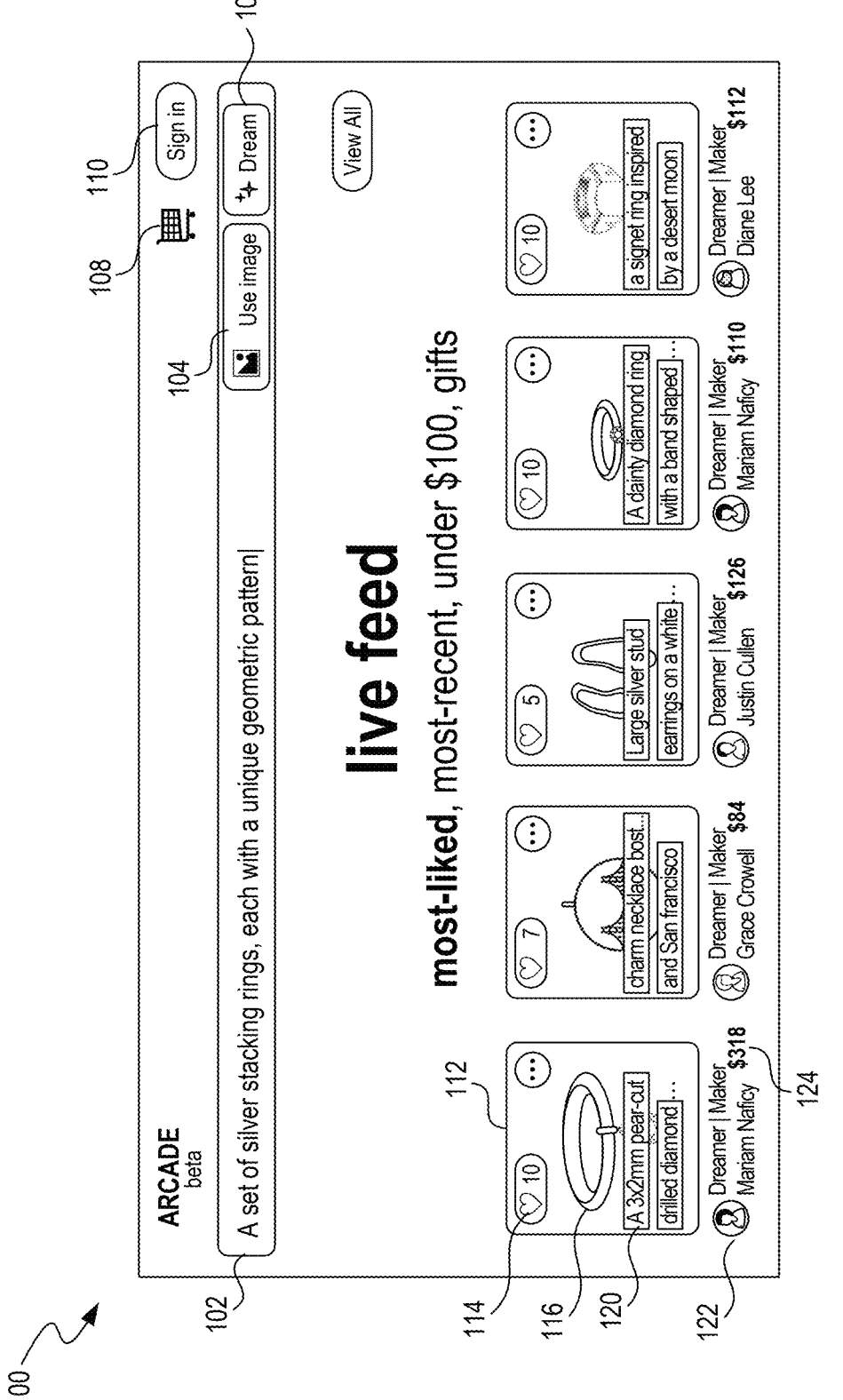
FIG. 1 is an example of a user interface for an online storefront through which at least some operations described herein can be implemented.

The technologies described herein will become more apparent to those skilled in the art from studying the Detailed Description in conjunction with the drawings. Embodiments or implementations describing aspects of the invention are illustrated by way of example, and the same references can indicate similar elements. While the drawings depict various implementations for the purpose of illustration, those skilled in the art will recognize that alternative implementations can be employed without departing from the principles of the present technologies. Accordingly, while specific implementations are shown in the drawings, the technology is amenable to various modifications.

DETAILED DESCRIPTION

The disclosed technology leverages consumer interest in personalizing, owning, and creating unique products. The technology can generate images of synthetic products that represent conceptual products that are generated based on user input. The conceptual products can be purchased and then physically produced. A technique involves receiving user input in various forms, such as natural language text, speech, user mouse movements, user swipes, user clicks, or images, and configuring this input into a prompt for a generative artificial intelligence (AI) system. The AI system is part of a platform that processes the prompt to generate an image of the conceptual product, which is then presented in a user interface. Each conceptual product is associated with a unique identifier (e.g., a stock keeping unit (SKU)), and the method includes functionalities for purchasing the conceptual product, generating multiple versions with distinct physical attributes, and incorporating user feedback to improve the AI system. Additionally, the system determines pricing based on extracted physical attributes and supports manufacturing processes based on the generated images.

A system of the technology can create multiple versions of the conceptual product, each with unique identifiers and distinct physical attributes (e.g., volume, weight, dimensions, materials). A physical attribute of a product, as referred to herein, includes tangible and measurable characteristics that define physical presence and functionality. The physical attributes are useful for identifying, describing, and differentiating products. Examples of physical attributes include dimensions, size (e.g., length, width, height), weight, shape, color, material, texture, pattern, durability, finish, design, ergonomics, packaging, and functionality.

The platform can generate multiple versions of a given product, ensuring that users can explore different iterations and designs of conceptual products. For instance, if a user is conceptualizing a chair, the system can generate various versions with different fabrics, colors, and structural designs. This capability allows users to view and compare a diverse range of options, enhancing their ability to make informed design decisions.

The system can present these versions on the user interface, allowing users to select, purchase, and initiate the production of the physical product based on their preferences. The system can also preprocess user input to create prompts that generate multiple manufacturable versions of the conceptual product, analyzing manufacturability constraints, and incorporating real-world and synthetic data to train the AI models. The system can also incorporate user feedback to refine the AI-generated images and can determine pricing based on physical attributes such as volume, weight, dimensions, and materials.

The disclosed technology thus enables the design of entirely unique products from scratch, with automatic manufacturing and shipping processes. This technology eliminates the complexity associated with manual product design and creation, thereby fulfilling an unmet market need. In contrast, traditional methods of creating custom products involve interaction with human designers and artists, resulting in high costs and significant time consumption, especially when compared to the rapid service provided by conventional online stores. The design process often requires discussions between the customer and a representative to create a product that meets both the user's preferences and the manufacturer's capabilities. Moreover, the final cost is determined once the design is finalized and the cost of materials and labor has been estimated.

The description and associated drawings are illustrative examples and are not to be construed as limiting. This disclosure provides certain details for a thorough understanding and enabling description of these examples. One skilled in the relevant technology will understand, however, that the invention can be practiced without many of these details. Likewise, one skilled in the relevant technology will understand that the invention can include well-known structures or features that are not shown or described in detail to avoid unnecessarily obscuring the descriptions of examples.
End-to-End Experience The disclosed technology enables the creation of unique, user-specified items through the use of AI technologies. In some embodiments, a user inputs an unstructured description of a product that they would like to purchase into an interface that is administered by a system. The user interface can include a web page or application, for example. The input can include any free-form input including natural language text, natural language speech, user touch or mouse interactions, and/or images (e.g., hand-drawn sketches or pictures). In other words, the user is not limited to selecting from a menu of options or modifications for preexisting designs of products having predetermined specifications.

In response to user input, the system presents a user with one or more versions of a conceptual product that are generated by AI models and include representations of a real product. The conceptual product is immediately purchasable. In one example, the system generates one or more images of the conceptual product. The image(s) can include representations of one or more versions of the conceptual product and accompanying information such as dimensions, weight, price, lead time (e.g., time taken to create the product). At least part of this descriptive information can be contained or indicated in an identifier (e.g., SKU) that is unique to the conceptual product and generated automatically and simultaneously with the generation of the conceptual product's images and descriptive information. This allows the user to receive real-time results and avoids the lengthy time periods associated with conventional methods of drafting concepts, negotiating price, and creating concept art. When the user chooses to purchase a conceptual product, the product's information is sent to a manufacturer who creates the product and sends it to the user. This results in a much faster process for creating user-specified items that mimics the familiar online shopping experience and allows real-time generation of conceptual products that can be purchased and delivered as a fully realized physical product to the user.

One aspect of the technology involves using AI models (or other algorithms) to match a nonexistent conceptual product with a potential manufacturer that is well equipped to produce a physical instance of the product. This takes into account the capabilities of the manufacturer and the price of the products they produce and incorporates user feedback. The models can select a manufacturer based on either the user description of the conceptual product, one or more images of the conceptual product (supplied by the user or generated by a machine learning (ML) model), or a combination of both. In addition, the user may be able to specify a preference as to the manufacturer, which can be taken into account.

In addition, the AI models used in this technology can be configured to incorporate manufacturability constraints. This can be done, for example, by careful managing of the prompt or training the models on a subset of training data that conforms to these manufacturability constraints so that their generated output will be likely to conform to the same constraints. These techniques can consider constraints common to all products (e.g., avoiding self-intersections or other physically impossible configurations, avoiding products that are too large to be delivered to the user, avoiding products that are prohibitively expensive), common to a category of products (e.g., avoiding jewelry that is unreasonably large or small, avoiding furniture made from impractical materials), common to a particular manufacturer or group of manufacturers (e.g., avoiding products of certain categories or that use certain materials that the manufacturer cannot produce), or any combination thereof.

As used in this description, a "maker" or "manufacturer" is any entity that is capable of creating a physical product that is purchased by a customer. References to "images" or "an image" may also include other suitable media formats such as video or 3D digital models.

FIG. 1 is a depiction of an online storefront 100, through which aspects of the present technology can be presented to a user. It includes a text input field 102 configured in a way similar to a search bar and includes a button 106 to process the text input by the user. This also includes an option 104 to input images. The storefront 100 includes the ability to interact with user information, such as account information 110 and the user's current shopping cart 108. Included in the storefront 100 are product listings 112 of real or conceptual products. These listings include a rating 114, one or more images 116, a description 120, and a price 124. The storefront can also indicate the manufacturer or designer 122.

Figure 2A:
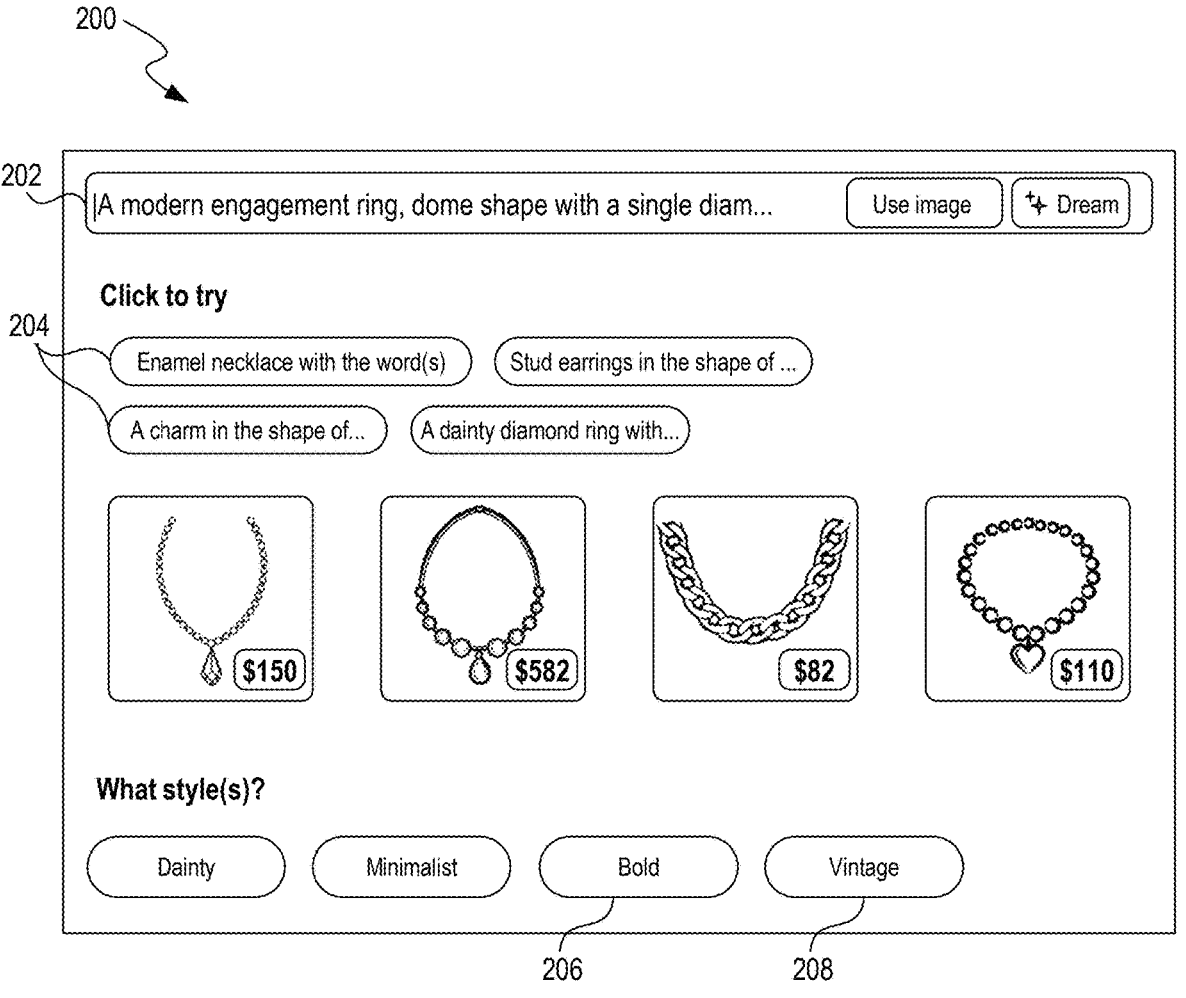
FIGS. 2A and 2B are examples of user interfaces for an advanced search functionality that can serve as a user interface through which at least some operations described herein can be implemented.
Figure 2B:
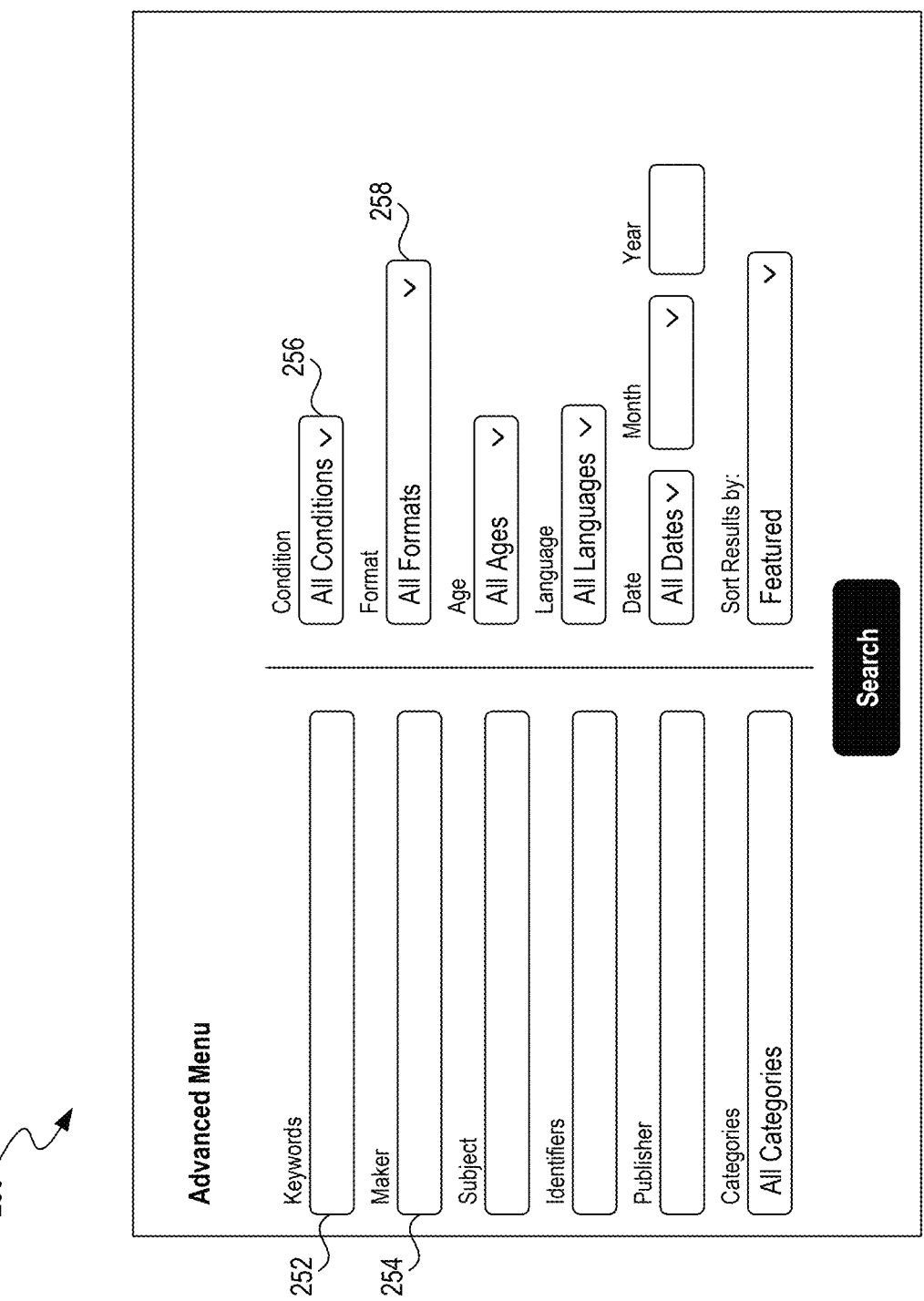

FIGS. 2A and 2B show examples of advanced description options, configured in a way that is similar to an advanced search option in conventional online storefronts. The advanced menu 200 includes a text input field 202 configured in a way similar to a search bar and suggestions 204, 206, 208 for advanced descriptions of the conceptual product. The advanced menu 250 includes text input fields 252, 254 and dropdown menus 256, 258 that influence specific aspects of the conceptual product description. It also includes pre-populated fields for common attributes and categories of conceptual products, which can be selected by the user.

In some implementations, the system can accept a variety and combination of input modalities to enhance user interaction and product personalization. As indicated earlier, one such modality beyond text is image input, where users can upload images or videos that depict a desired style, color or other features of the product. In one example, the system employs computer vision algorithms to analyze these visual inputs, extracting relevant attributes such as color, texture, shape, or other stylistic elements. For instance, when a user uploads an image of a room, the AI model analyzes the room's décor elements and generates furniture designs that align with existing aesthetics, ensuring visual harmony within the space. Similarly, video inputs can be processed frame-by-frame to capture dynamic aspects and provide a comprehensive understanding of the user's preferences for a particular product.

In one example, when users upload an image of a room, the system performs contextual analysis to understand the spatial and design elements of the environment. Using techniques such as semantic segmentation and object detection, the AI model identifies furniture, decor, and architectural features present in the room. This contextual information is useful for generating products that complement the existing space. For example, the system can create furniture items that match the room's color scheme, dimensions, and overall style, ensuring that the new product integrates seamlessly into the user's environment.

Voice input offers an additional modality for users to interact with the system. Users can verbally describe the product they envision, and the system can process this input to generate a corresponding product design. In one example, the system leverages natural language processing (NLP) and speech recognition technologies to interpret a spoken description. The system can use NLP techniques to extract key phrases and product specifications, which are translated into structured prompts for the image-generating model. This feature enhances the system's accessibility, accommodating users who prefer hands-free interaction or those with disabilities that make text-based interfaces challenging to use.

Inspiration images, such as those curated in a mood board, voice-based input, browse-based input (e.g., TikTok®, Tinder®) represent another input technique. In one example, users upload a collection of inspiration images that reflect their desired style or aesthetic. The system analyzes these images collectively using machine learning algorithms, such as clustering and pattern recognition, to identify common themes and stylistic elements. These themes or elements are used to generate new product designs that capture a desired aesthetic. By considering multiple images simultaneously, the system can create a cohesive and representative product that aligns with the user's vision.

Interactive gesture inputs, such as swipes, provide another techniques for users to convey their preferences via touch or immersive environments. For example, users can engage with a visual interface where they can swipe right to like or swipe left to dislike pre-existing product images. In one example, the system utilizes reinforcement learning techniques to analyze these interactions, identifying patterns and preferences based on user feedback. The system can subsequently generate custom product designs that align with the inferred tastes.

The system's flexibility in handling various input modalities—images, videos, voice, inspiration images, interactive gestures, and room images—allows for a highly personalized product creation experience. By integrating these inputs, for example, the AI model can generate products that are not only aesthetically pleasing but also functionally suitable for the user's needs. The multi-modal approach enables the system to capture a comprehensive understanding of user preferences and deliver tailored product recommendations. These techniques ensure that the generated products are representative of the user's vision, providing a seamless and intuitive product creation experience.

Prompt Preprocessing

In one embodiment, the user interface is hosted on a publicly accessible website that is configured to be similar to a conventional online storefront in terms of both visual appearance and user interaction. This online storefront can include conveniences such as a virtual shopping cart, wish list, search bar, information concerning product manufacturers, product listings, product information, and capabilities for purchasing and delivering products. The product listings and information in this online storefront may describe products that are either real, physical products that are currently in production or may be of conceptual products that have not yet been physically manufactured. The images associated with these products can be photographs of physical items, artistically created images, digital renderings, or images created by generative AI/ML models.

A user of this online storefront has the ability to describe a conceptual product. In one instance, the experience is similar to searching for a product in a conventional online storefront in which a short description is entered into a text input field. There may be advanced options for more specific descriptions, including input fields for common qualities of the product such as type, color, price, brand, or manufacturer. In some instances, the user is prompted to describe the product using natural language and supply all intended characteristics and limitations as a single passage of text or transcribed speech. In addition, the user could input one or more images as image input. The image input could be of a real product, a drawing, a digital 3D model rendering, an AI-created image, or any other visual representation or combination thereof. In some implementations, a text description is created from the image input, which the user can edit and use as the conceptual product description. The text description, images, and other media such as video or 3D models that the user indicates as representative of the conceptual product is considered the full conceptual product description.

The conceptual product description is processed by a prompt layer. The prompt layer uses one or more AI/ML models to process the user-supplied information. The prompt layer processes the conceptual product description and extracts important product attributes, for example, by searching for keywords in the textual description. The prompt layer can store these product attributes for later use. The prompt layer uses this information to generate a prompt for an image-generating ML model ("image-generating model") that will be used to create one or more images of the conceptual product. This generated prompt is created to give the best results from the image-generating ML model. Such generation can consider aspects of the image-generating model such as model architecture, training data, or example results generated by the model and their associated input prompts. This generated prompt can be a modified version of the user-supplied prompt or entirely novel. The prompt layer sends this prompt to the image-generating model to generate one or more images of the conceptual product.

In some instances, the prompt layer chooses an image-generating model from a set of models based on the extracted product attributes. For example, the prompt layer may choose a manufacturer or set of manufacturers based on these attributes and choose an image-generating model that is configured to create images of conceptual products that these manufacturers are capable of producing.

The models used in the prompt layer can also consider manufacturability constraints when generating an output. For example, it may refrain from generating a prompt that includes unrealistic or contradictory product attributes such as a stove made from flammable materials, jewelry made from toxic metals, or products that are too large to be shipped to the user. In other instances, these manufacturability constraints may be implemented by the image-generating models. This can be instead of, or in addition to, being considered in the models used for the prompt layer.

Maker-Based Image-Generating Models

The prompt describing the conceptual product (which can either be created by the user or by the prompt layer) is processed by an image generation layer. The image generation layer uses one or more image-generating models to generate one or more images of the conceptual product. These models are designed to generate images that accurately depict the conceptual product as described but also account for manufacturability constraints to generate a realistic depiction of a product that can be physically created. Such possible manufacturability constraints are numerous and vary widely based on the category of the product in question. For example, for a jewelry product, manufacturability constraints can include structural integrity, material properties, material color (e.g., ensuring that representations of particular materials are realistically colored), gem size and type (e.g., if certain gemstones of a certain size can reasonably be found or produced), and embellishment constraints (e.g., if a certain pattern or design on the jewelry is too small or detailed to be feasible).

For a furniture product, manufacturability constraints can include stability, structural integrity, and material choice, each possibly factoring in intended use (e.g., avoiding weaker materials for pieces that are meant to support heavy objects but not for pieces that are meant to be purely decorative). In an example of a rug product, manufacturability constraints can include material durability, colorfastness, pattern complexity, and size limitations (e.g., ensuring that the rug can be produced in standard sizes or custom dimensions as required). Additionally, constraints can involve the types of fibers used (e.g., wool, synthetic fibers) and the weaving techniques available to the manufacturer. Such manufacturability constraints can also be specific to certain manufacturers by, for example, ensuring that generated images do not contain materials that a certain manufacturer is not capable of incorporating into a product. These models can include publicly accessible or subscription-based models, such as ChatGPT or Gemini.

In some implementations, image-generating models consider these manufacturing constraints by being trained on data that is chosen to enforce the constraints, for example, by being trained only on images that a particular manufacturer or group of manufacturers are able to create. It is known that ML models generate content that conforms to the distribution and characteristics of the data used to train them. Therefore, by specifically curating the training data to include only those images that satisfy particular manufacturing constraints, it becomes highly likely that the images generated by these models will also satisfy those constraints. By including data that is specific to a manufacturer, a model is more likely to produce images that can be physically created by that particular manufacturer. This principle also applies to groups of manufacturers, to categories of products, and combinations thereof.

Maker-Agnostic Image-Generating Models

In some implementations, the image-generating models are maker-agnostic, meaning they are general models trained on data from multiple manufacturers or without specificity to any manufacturer. The maker-agnostic approach allows models to generate images that are plausible and likely to meet the manufacturability standards of numerous, non-specific manufacturers, enhancing the flexibility and applicability of the platform in generating realistic, manufacturable product designs.

By being trained on diverse datasets that incorporate a range of manufacturability constraints across various product makers, general models ensure that generated images are compliant with common manufacturing capabilities. By focusing on diverse training data, the technology ensures that the generated images are not only feasible for various manufacturers but also broadly applicable, thereby supporting a wide array of user-specific design needs across different product types.

In contrast, maker-specific models are tailored to the unique capabilities and constraints of specific manufacturers, ensuring that the products generated align with the manufacturers' production techniques and material specifications. In another example, by combining both types of models, the platform can optimize the product generation process, ensuring that the final output is both creative and manufacturable.

Artistic-Style Models

The platform can also support artist-specific, fine-tuned models that are specifically designed to produce printable artwork in unique aesthetic styles. These models can be trained using transfer learning on architectures like Style-GAN2. The generated artwork is not necessarily meant to be sold as a standalone digital product but can be printed onto various physical products such as t-shirts or mugs. This ensures that while the artwork remains digital, it is integrated into tangible merchandise. For instance, a user could fine-tune a model to reflect their abstract art style, and the platform can then print this artwork onto physical products, combining creative expression with product design.

Selection of Image-Generating Models

In one instance of this technology, an image-generating ML model is chosen from a set of models, each model of which is configured for a specific use case. For example, some models may be designed to generate images of products of a certain category, such as jewelry, home décor, furniture, electronics, textiles, ceramics, home hardware (e.g., faucets) or clothing. In another example, models are associated with a particular manufacturer or group of manufacturers, such that a model only generates only images that the particular manufacturers are capable of producing. In another example, models are not specific to any manufacturer but could be specific for product categories. Furthermore, models may be trained with a combination of these goals in mind. An example would be a model trained to generate images of jewelry that a particular manufacturer is likely capable of producing.

If an instance of the technology incorporates a structure of image-generating models and a prompt layer, a prompt layer model could choose an image-generating model based on the extracted product attributes so that the model can capture as many details of the conceptual product as possible while also being as realistic as possible. Alternatively, the user may be able to choose an image-generating model directly and input their own prompt to create a set of images.

In an instance of this technology, the attributes of the user-supplied description are used to quantify characteristics of the conceptual product such as a category or a suitable manufacturer. The prompt layer may expose these characteristics for use by other layers. The prompt layer chooses an image-generating model that fits the conceptual product and writes a prompt tailored to that model. This prompt accounts for manufacturability constraints and factors such as, for example, the types of products that the manufacturer is able to produce and the materials they have access to. In another embodiment, the prompt layer does not explicitly choose a manufacturer but rather considers the constraints of a group of manufacturers. Cost of production can also include the effect of standing agreements pertaining to the manufacturer, including agreements that affect their involvement in being a manufacturer that produces conceptual products that are the result of the present technology. This consideration is used to influence the text of the generated prompt, the image-generating model that is chosen, or both.

In some instances of the technology, the image generation layer can generate media other than images, including videos, digital 3D models, or textual descriptions, that characterize the conceptual product. Other layers would be designed to accept these forms of media in place of, or in addition to, generated images.

Image-to-Price Process

The images that are generated of the product concept are processed by an image analysis layer to determine attributes relevant to the user and the manufacturer, such as weight, material, and price. In some embodiments, the manufacturability constraints that enforce a feasible product are enforced in the image-generating model, and the resulting generated images are a better source for the description of a physically realizable product than either the user's description or the product attributes extracted from the prompt layer. However, this analysis can also factor in these data if they are determined to be relevant in a particular implementation of this technology.

The image analysis layer includes an ML model that has been developed to extract, estimate, or predict physical characteristics of the products represented in a set of images. In some implementations, these images are the generated images of a nonexistent conceptual product produced by one or more image-generating models. However, the set of images can also be photographs or other depictions of real products. This model (also known as a volumetric model) is designed to quantify a set of physical characteristics of the product in images, such as volume, total weight, linear dimensions (e.g., height, length, width), materials used, and the amount or weight of each material used.

An ML model used in the image analysis layer may also be able to detect details or embellishments on images, such as patterns, designs, gemstones, and text. These details may affect the overall manufacturability, price, and lead time of the resulting product.

In some implementations, the image analysis layer also has the capability to recommend a manufacturer or group of manufacturers for the conceptual product. It may provide a quantitative measure of the expected suitability for manufacturers for producing the conceptual product. This analysis can be based on factors and manufacturability constraints, such as the capability of manufacturers, the materials they work with, the complexity of their products, the category of products they produce, the expected cost and final price of the manufactured product, and the lead time. This analysis and/or recommendation can be in addition to, or as an alternative to, manufacturer suitability data generated by the prompt layer. This is useful in implementations in which the prompt layer is not well suited to decide a manufacturer. In some implementations, the image-generating models are expected to be more effective at incorporating manufacturability constraints, and therefore the generated images of the conceptual product may be a more accurate source for determining the most suitable manufacturer for creating a particular product.

A price analysis layer is used to determine the expected price of the conceptual product to the user. This layer can consider all information provided by previous layers, including factors such as the category of the product, the suitability of manufacturers as provided by the prompt and/or image analysis layers, complexity, materials, size, and embellishments. The price analysis layer uses pricing algorithms to predict the price of the conceptual product. This price may factor in the cost to the manufacturer to produce, the profit margin expected by the manufacturer, and/or the profit margin expected by other relevant parties. This allows for real-time accurate pricing of products in a way that avoids the tedious and expensive conventional appraisal and analysis procedures.

It should be appreciated that the models in the preceding description can be used in multiple ways involving different orderings, with data transferred between the models in multiple possible ways. For example, the prompt layer may quantify the suitability of manufacturers but not use the information to choose an image-generating model, instead only supplying it to the price analysis layer. In another example, the price analysis layer can be used multiple times, once for each possibly suitable manufacturer as quantified by the prompt layer and/or the image analysis layer, and a price can be calculated for each manufacturer. In another example, multiple image-generating models can be chosen based on the manufacturer suitability quantified by the prompt layer, and the resulting images could be compared to each other for their consistency with the user's product description.

Presentation to the User

The information pertaining to the product can be indicated in a unique identifier (e.g., SKU), which is an identifier that is unique to the conceptual product and may include references to qualitative or quantitative aspects of the conceptual product such as category, manufacturer, weight, and/or color.

The information generated about the conceptual product is presented to the user. This can be presented in a format resembling conventional web-based storefronts, where the product image, details, and the option to purchase are presented to the user as a product available for purchase. In some implementations, an ML model will generate a natural language product description, which may include practical uses or other information. This description may also be represented in the SKU.

User Modification

The user is given the opportunity to modify a product listing. This could be either a real product or a conceptual product, such as those generated from a user description. User-supplied modifications can be to the product itself (e.g., design, material, color), an aspect of the product listing (e.g., changing the proposed manufacturer), or a combination of both (e.g., reduce the price by changing size, material, or other physical aspect). In some implementations, the user may be able to modify the setting or environment of the product in the images. Examples include changing lighting conditions, changing location (e.g., indoors or outdoors), changing context (e.g., on display versus being worn), or changing the size of the image. If the product is shown in an image incorporating a human model (e.g., being worn by a human or incorporating a human to show the scale of the product), the user may also have the option to specify characteristics of the human model.

In some implementations, these modifications make use of the previously described aspects of the present technology. For example, when modifying a conceptual product generated from the user's description, the user can input a new product description, and the layers described above can modify content presented in the product listing instead of generating completely new content (e.g., the prompt layer can create a new list of product attributes that is a combination of attributes extracted from the original prompt and the user's new prompt). In another example, the user inputs a product description that references the original description and/or the presented content of the product listing (e.g., "Add another gemstone to this product"). The layers described above can use existing content (either real or previously generated) along with the new description to modify the product listing.

In some implementations, modifying the product listing uses an image-to-image ML model. This model may be chosen based on product attributes. This model accepts various forms of user input to determine how to modify the images of the product listing. For example, the image-to-image model may accept text input from the user describing how to modify an image. In addition, the model may accept data concerning regions of the image to modify, such as by using a spatial mask defined by the user. The modified images are processed by the image analysis and price analysis layers to create a new product listing.

The product listing presented to the user could also include pre-selected options to change common attributes of the product. For example, there may be options for the user to change the material, size, color, or other attributes of the product by selecting these from a list presented to the user. These options may be pre-chosen based on product category and/or manufacturer or may be suggested algorithmically (e.g., by using an ML model). When the user chooses one of these options, another product listing can be generated. This generation can be implemented in a variety of ways. One implementation involves modifying the original conceptual product description given by the user and repeating all steps in creating a product listing. Another implementation involves modifying the existing (real or generated) content (e.g., using an image-to-image ML model to change the color and analyzing the result with the image analysis and price analysis layers). In other implementations, these common alternates could be automatically created alongside the primary product listing, so that they are ready to present to the user at the time the product listing is presented.

AI-Based Editor

The platform can include an AI-based editor tool that leverages AI algorithms to enable users to make targeted edits to specific areas of a product image. This involves precise modifications such as altering colors in a product, gemstones in jewelry, and design elements within the existing product framework. Users can execute these edits through multiple interfaces including text-based commands, voice commands for hands-free operation, and an interactive Microsoft-Paint-like interface that provides tools like a paintbrush, eraser, and pen for more direct manipulation.

To invoke the editor tool, a user navigates to the product listing containing the image of the conceptual product. The user then locates and selects the option to use the editor tool, which could be labeled as "Edit Product" or "Magic Editor," thereby opening the editing interface. Within the editor tool, the user can input desired modifications through various methods. They can type in text-based commands such as "Change gemstone color to red" or "Modify the upholstery to green." Alternatively, users can utilize voice commands like "Make the handles stainless steel" for a hands-free editing experience. For more detailed and direct manipulation, the editor provides an interactive Microsoft-Paint-like interface with tools such as a paintbrush, eraser, and pen.

Using the editor's advanced AI-driven tools, users can make precise adjustments. Color changes are facilitated by color transfer algorithms, ensuring seamless transitions without affecting the image quality. Mask generation through CNNs allows users to edit specific areas with high precision. Once the modifications are made, users submit these changes via the platform's interface.

The platform then re-processes the image (or a portion thereof) using models to ensure the revised image adheres to both aesthetic and manufacturability criteria. The system checks the modifications against manufacturability constraints, including material availability, production techniques, and cost efficiency, to ensure all adjustments are feasible.

After confirming the changes, the platform generates the revised product image and proceeds with image refinement to enhance quality. Super-resolution techniques powered by Enhanced Deep Residual Networks (EDSR) and Generative Adversarial Networks for Super-Resolution (SRGAN) can be employed to refine and increase the resolution of the image. This ensures a high-quality, clear depiction of the product's features, for online shoppers who need to inspect product details closely.

The user can then review the revised product image and corresponding product details. If the modifications meet their expectations, they confirm the changes. The platform updates the product listing with the new image and details to ensure the product remains immediately manufacturable and purchasable. Hence, this entire process not only facilitates user customization but also ensures that the resulting product is viable for production and sale.

Image Upleveling Process

After initial image generation and any subsequent user edits, the platform can employ an image upleveling process to enhance the visibility and quality of the product images. This process involves applying super-resolution techniques powered by, for example, enhanced deep residual networks (EDSR) or generative adversarial networks (SRGAN). These techniques increase the image resolution and refine its details, ensuring a high-quality, clear representation of a product's features. This is particularly beneficial for online shoppers, as the improved image quality allows them to examine product details more closely, leading to better-informed purchasing decisions.

Creation and Delivery

When the user purchases the product in a given product listing, the details are sent to the chosen manufacturer. These details can include any product attributes created by the prompt layer, any images or other media (e.g., video, 3D digital models), information about the materials, the expected lead time, and the price of the product, which can include the expected cost to the manufacturer. The manufacturer makes the product according to the specifications, material, and lead time and ships the final product to the user.

In some implementations, the user has access to regular updates about the manufacturer's progress and receives images of the product throughout production. The user can send feedback to the manufacturer as they are creating the product to further refine the final product. The user can be given the option to approve the final product.

Feedback

The disclosed technology can incorporate user feedback at many key points. In some implementations, the user is given the option to rate their final product and the manufacturer. This can be used, for instance, by ML models described above (particularly those in the prompt layer and/or the price analysis layer) when quantifying the suitability of certain manufacturers to produce conceptual products. For example, manufacturers with low user ratings may be given lower suitability scores and thus become less likely to be recommended. In another example, manufacturers with a low user score in a particular category, or for products with particular product attributes, may be given a lower suitability score for those products and thus become less likely to be recommended for those products. These scores can be incorporated into a data pipeline with other metrics used to improve the components of the present technology.

In some implementations, the user is given the option to rate the conceptual product images that have been generated for a product listing. This rating can concern image qualities such as realism, overall aesthetics, and faithfulness to the user's given description. This feedback can be used to improve aspects of generating product listings. For example, images with a high rating can be used as training data for image-generating models to improve future output. This data could also be used as positive feedback for model-specific prompts generated by the prompt analysis layer and for how the prompt analysis layer decides which image-generating models to use.

Furthermore, some implementations include a quality assurance (QA) layer that assesses each generated product concept image on quality metrics such as faithfulness to prompt, design quality, and image deformities. This can be performed by a human or can be part of an automated self-evaluation process. This feedback data can then be used to regularly train the ML models used in the system in order to keep them up to date and to fix particular user concerns. In the same way, a QA layer can assess the prompts generated by the prompt layer on quality metrics such as faithfulness to the user's conceptual product description, the reliability of the prompt for creating accurate images, and number of product attributes extracted.

In some implementations, quality assurance is applied to the manufacturer-specific image-generating models. This can include tests to assess the fit of a manufacturer to a workflow that includes conceptual product generation, manufacturability tests to ensure that the manufacturer is able to produce conceptual products generated by ML models, and regular reevaluation of the pricing algorithms used to price the conceptual products to align with the manufacturer's ability and profit goals.

User-Specific Designs for Storefronts

The platform includes functionality tailored for users such as merchants, artists, celebrities, or entrepreneurs, allowing them to create AI generated products for resale. This means users can use the platform for personal purchases as well as designing and selling products intended for others. The platform can integrate e-commerce functionalities that accommodate order processing and interact seamlessly with external fulfillment services. A feature allows user designs to be publicly purchasable, enabling a popular influencer to design customized merchandise and host it on a storefront for their followers to purchase directly.

This feature enables users to transition into roles as merchants by providing a platform for creating, hosting, and managing storefronts with unique, user-designed products. The technology incorporates user-friendly processes along with robust security measures, ensuring users can engage in their entrepreneurial activities while protecting creative outputs.

Users can register on the platform as merchants, providing details such as their name and personally identifiable or business information. This information undergoes verification to ensure user authenticity, which is particularly important for celebrities or public figures. After successful verification, users can access the storefront creation interface, where they can name their storefront, write a description, and choose or customize a template to fit their brand's aesthetic.

The AI system is used to generate images of the conceptual product as described in this disclosure, ensuring that designs comply with manufacturability constraints. Users can manually refine these AI-generated images by adding unique signatures or other identifying elements, ensuring the images are personalized and copyrightable. After finalizing product images, users present them on the storefront accompanied by detailed product information, such as dimensions, weight, price, and lead time. Each product receives a unique identifier (e.g., SKU). Users publish their storefronts, making them available to potential buyers. Users can continually update their stores, adding new product lines to keep the shopping experience fresh for returning customers.

To protect product designs associated with users from unauthorized copying, the platform can utilize security measures, including watermarking and digital rights management (DRM). For example, product images can be automatically watermarked with the user's signature and other identifying details to discourage unauthorized use. DRM technologies can be employed to track and monitor image usage, thereby preventing unauthorized distribution and access.

Processes for Generating a Purchasable Product From User Input

Figure 3:
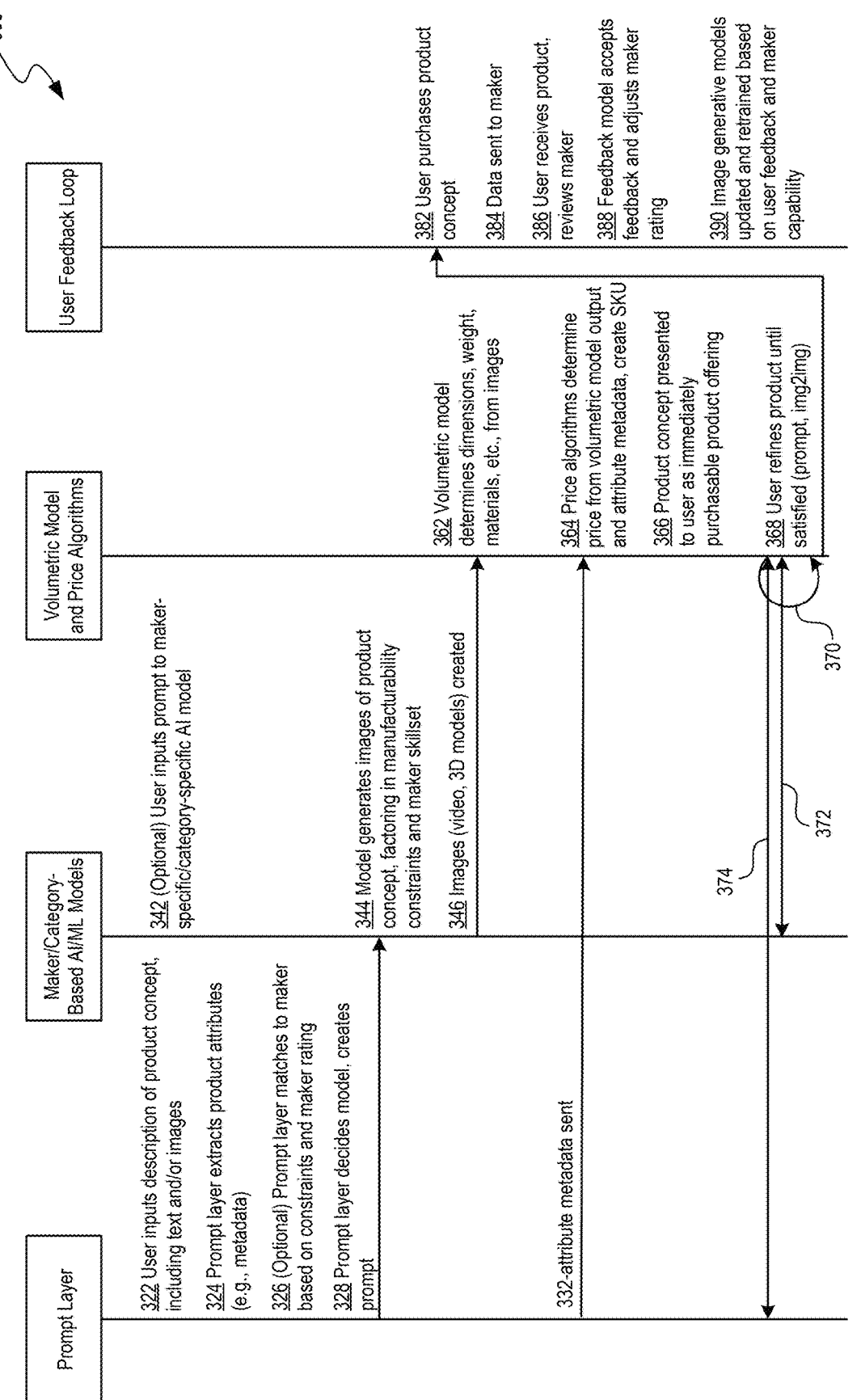
FIG. 3 is a flowchart for processes of generating a fully realizable product from a user description.

FIG. 3 is a flow diagram of one or more processes 300 of the present technology. The operations of the processes 300 are not limited to any particular order, as implementations could include operations of the processes 300 in various orders, omitting some operations and including other operations not shown for the sake of brevity. The operations can be performed by one or more servers or user devices in a distributed manner or in a centralized manner. Further, the operations can be performed by hardware or software including modules or components that implement AI technologies to create purchasable products from user inputs.

At 322, a user enters inputs including a free-form description of a nonexistent product, which is analyzed by a prompt layer (e.g., software and/or hardware module). Examples of user inputs include natural language text, natural language speech, or one or more images or another visual material. Natural language text or speech refers to written or spoken language that is used by humans for everyday communication in conversation, writing, and other forms of communication, as opposed to artificial or formal languages like programming languages or mathematical notation. The images can include photographs of real-world scenes or documentation, illustrations that are hand-drawn or digitally created, diagrams, flowcharts, or the like.

At 324, the prompt layer analyzes the user description to extract product attributes. In some embodiments, the prompt layer at 326 uses the extracted attributes to select a particular manufacturer-specific image-generating model based on manufacturability constraints and user ratings. At 326, the prompt layer creates a prompt based on the user description, which is optimized for creating realistic depictions of the conceptual product described by the user.

At 328, the prompt layer decides on a category, model, and/or manufacturer to route the prompt. The prompt is then passed to the image generation layer containing AI/ML models that are designed to create images of conceptual products. In some embodiments, the user creates a prompt input at 342 that is directly processed by an image-generating AI/ML model ("image-generating model") rather than being preprocessed beforehand at the prompt layer. At 344, the given image-generating model processes the prompt and generates one or more images of the conceptual product based on the user description while creating a realistic depiction factoring in manufacturability constraints. If the image-generating model is manufacturer-specific, it may also include constraints pertaining to the ability of the manufacturer to create certain products. In some embodiments, the output generated at 344 can also include other forms of media, such as video or digital 3D models.

At 346, the output from the image-generating model is processed by a volumetric AI/ML model ("volumetric model"). At 362, the volumetric model produces values that characterize the physical properties of the conceptual products depicted in the images generated by the image-generating model. These properties can include the physical dimensions, the weight, the materials used, and the amount of each material, among other factors important to the manufacturability of the conceptual product. At 364, these physical properties are processed by price algorithms to determine the price to the user to create a physical realization of the conceptual product. In some embodiments, a price analysis layer sends the extracted product attributes to the price algorithm at 332. The price algorithm analyzes available data to create a price for the conceptual product and creates a product listing that includes the images, physical properties, and a unique identifier (e.g., SKU) that includes an indication or describes and encodes various properties of the conceptual product. At 366, the product listing of the conceptual product is presented to the user as a product that is immediately purchasable by the user.

At 368, if the user is not satisfied with the product listing, they have the option to modify and refine the conceptual product. This can be done in various ways, including using AI/ML models that directly refine the images of the conceptual product in 370, which are then analyzed by the volumetric model and price algorithms; creating new product attributes for consideration by the image-generating model in 372; or creating a modified prompt for the prompt layer in 374.

At 382, when the user is satisfied with the product listing, the user purchases the conceptual product. At 384, the information characterizing the product concept is sent to a manufacturer who is tasked with creating a physical realization of the conceptual product depicted in the images of the product listing. When this is completed, it is shipped to the user. At 386, the user receives the product and is given the opportunity to review the manufacturer based on the result of their work. This user feedback is incorporated into a user feedback loop. At 388, a feedback model that is part of the user feedback loop processes the user feedback of the manufacturer and adjusts the manufacturer's overall rating. In some embodiments, this rating is used in part to decide the image-generating model that is used in the image generation layer, as the prompt layer uses the extracted product attributes to choose a manufacturer-specific image-generating model based on fitting the extracted attributes to manufacturers and based on their user scores. At 390, the user feedback is further used to retrain and update the image-generating models by, for example, including as training data those images that are rated highly by users when presented in product listings.

Figure 4:
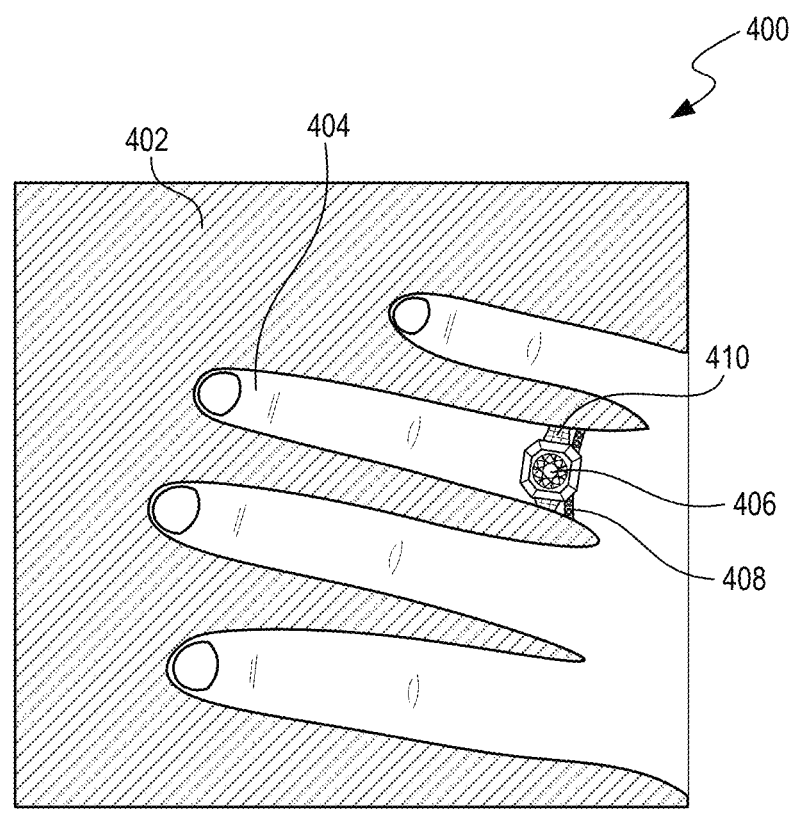
FIG. 4 is an example of an image of a product that can be shown to a user.

FIG. 4 is a depiction of an image 400 generated by an AI/ML model of a conceptual product. It includes aesthetic elements that focus on user experience, such as a background 402 and human model 404 to place the conceptual product in context. It also includes a depiction 406 of the conceptual ring product as well as details such as gemstones 408 and embellishments 410 that will be identified and analyzed by the price analysis layer described below.

Figure 5:
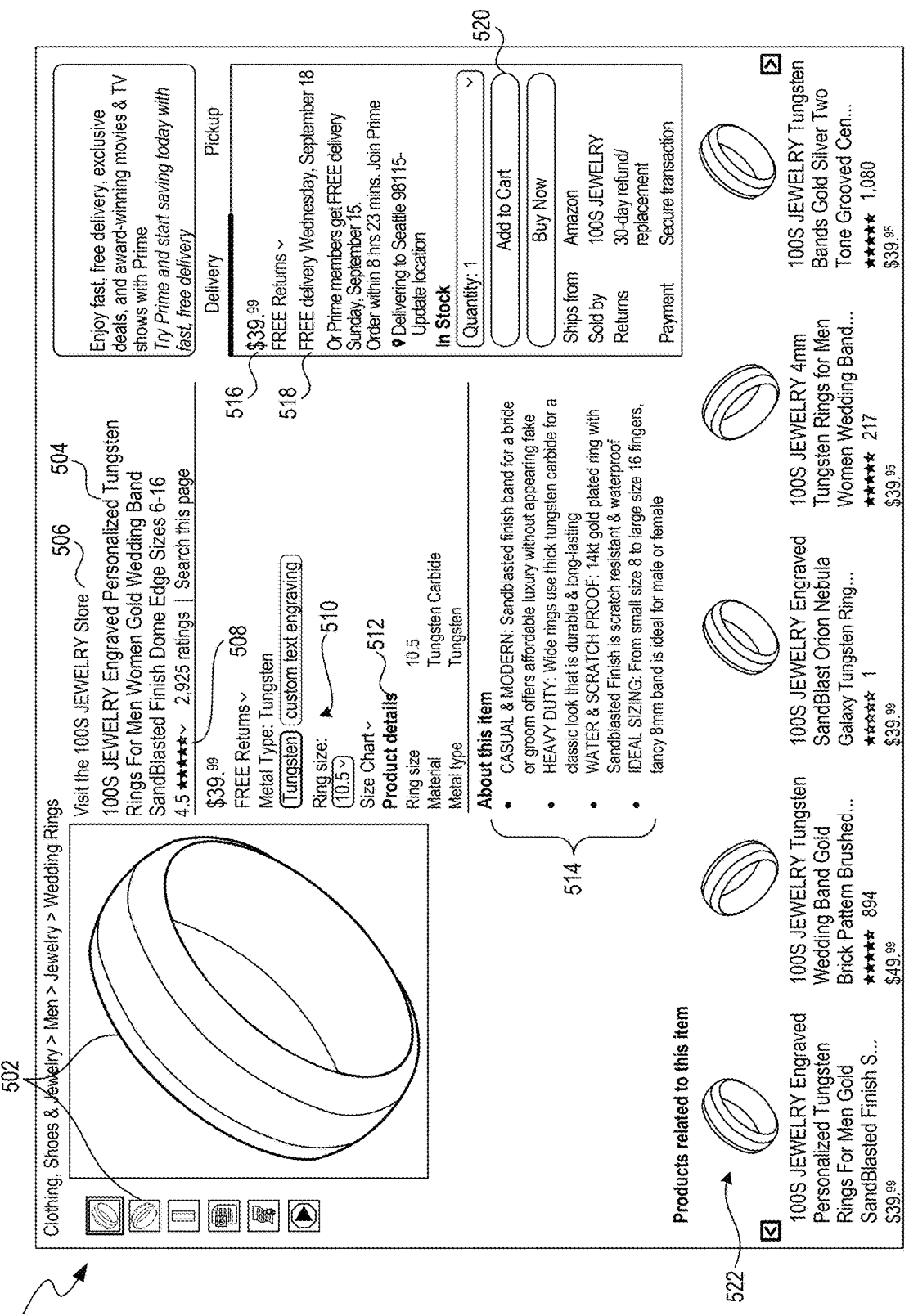
FIG. 5 is an example of a product listing on an online storefront in a format that can be used by at least some implementations of the present technology.

FIG. 5 is a depiction of a product listing 500, which can be of a real or nonexistent conceptual product. This includes one or more images 502 of the product, a title 504, potential manufacturers 506, product rating 508, product details 512, a product description 514, a price 516, an estimated lead time or time for delivery 518, and an option to purchase 520. It also includes options for common attributes 510, which a user may want to change. Also included are other product listings 522 of products that may be real products, conceptual products made by other users, or conceptual products generated automatically in response to the conceptual product that the user caused to be generated.

Computer System

Figure 6:
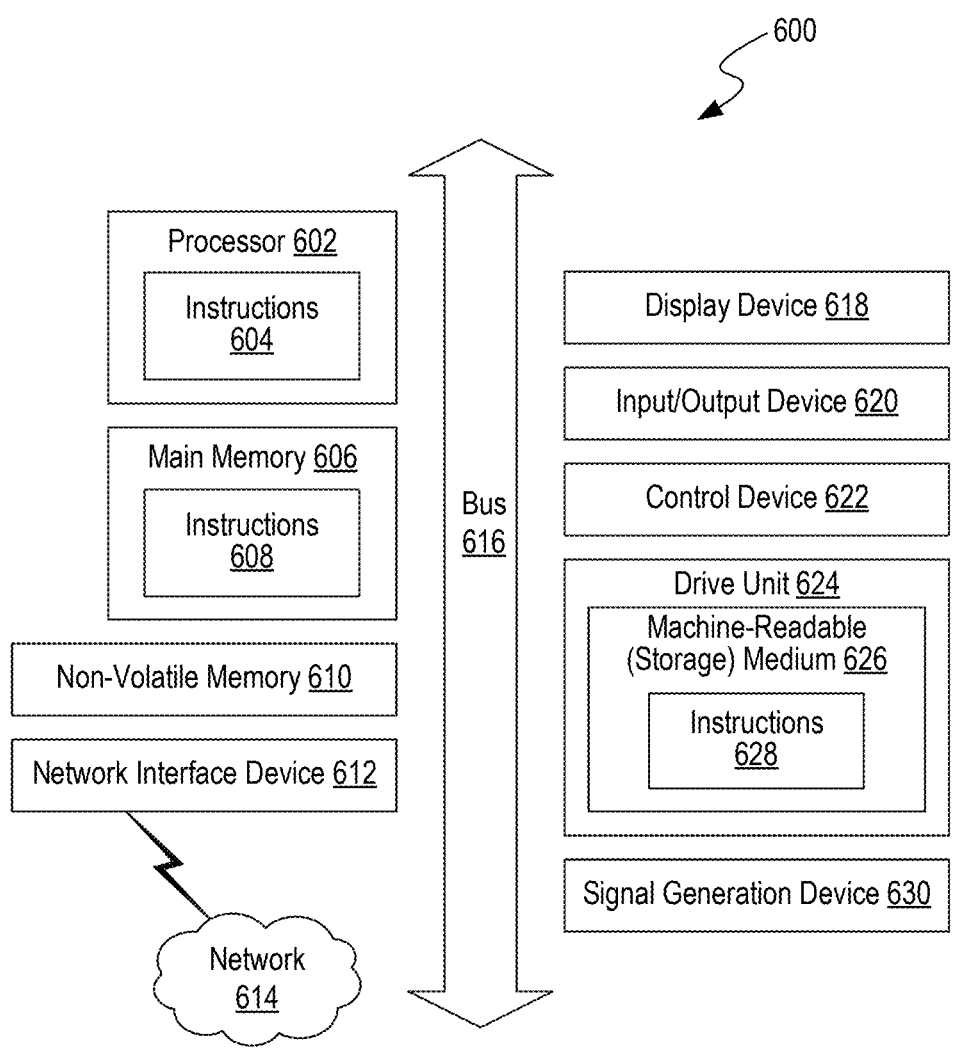
FIG. 6 is a block diagram that illustrates an example of a computer system in which at least some operations described herein can be implemented.

FIG. 6 is a block diagram that illustrates an example of a computer system 600 in which at least some operations described herein can be implemented. As shown, the computer system 600 can include: one or more processors 602, main memory 606, non-volatile memory 610, a network interface device 612, a video display device 618, an input/output device 620, a control device 622 (e.g., keyboard and pointing device), a drive unit 624 that includes a machine-readable (storage) medium 626, and a signal generation device 630 that are communicatively connected to a bus 616. The bus 616 represents one or more physical buses and/or point-to-point connections that are connected by appropriate bridges, adapters, or controllers. Various common components (e.g., cache memory) are omitted from FIG. 6 for brevity. Instead, the computer system 600 is intended to illustrate a hardware device on which components illustrated or described relative to the examples of the figures and any other components described in this specification can be implemented.

The computer system 600 can take any suitable physical form. For example, the computing system 600 can share a similar architecture as that of a server computer, personal computer (PC), tablet computer, mobile telephone, game console, music player, wearable electronic device, network-connected ("smart") device (e.g., a television or home assistant device), AR/VR systems (e.g., head-mounted display), or any electronic device capable of executing a set of instructions that specify action(s) to be taken by the computing system 600. In some implementations, the computer system 600 can be an embedded computer system, a system-on-chip (SOC), a single-board computer system (SBC), or a distributed system such as a mesh of computer systems, or it can include one or more cloud components in one or more networks. Where appropriate, one or more computer systems 600 can perform operations in real time, in near real time, or in batch mode.

The network interface device 612 enables the computing system 600 to mediate data in a network 614 with an entity that is external to the computing system 600 through any communication protocol supported by the computing system 600 and the external entity. Examples of the network interface device 612 include a network adapter card, a wireless network interface card, a router, an access point, a wireless router, a switch, a multilayer switch, a protocol converter, a gateway, a bridge, a bridge router, a hub, a digital media receiver, and/or a repeater, as well as all wireless elements noted herein.

The memory (e.g., main memory 606, non-volatile memory 610, machine-readable medium 626) can be local, remote, or distributed. Although shown as a single medium, the machine-readable medium 626 can include multiple media (e.g., a centralized/distributed database and/or associated caches and servers) that store one or more sets of instructions 628. The machine-readable medium 626 can include any medium that is capable of storing, encoding, or carrying a set of instructions for execution by the computing system 600. The machine-readable medium 626 can be non-transitory or comprise a non-transitory device. In this context, a non-transitory storage medium can include a device that is tangible, meaning that the device has a concrete physical form, although the device can change its physical state. Thus, for example, non-transitory refers to a device remaining tangible despite this change in state.

Although implementations have been described in the context of fully functioning computing devices, the various examples are capable of being distributed as a program product in a variety of forms. Examples of machine-readable storage media, machine-readable media, or computer-readable media include recordable-type media such as volatile and non-volatile memory 610, removable flash memory, hard disk drives, optical disks, and transmission-type media such as digital and analog communication links.

In general, the routines executed to implement examples herein can be implemented as part of an operating system or a specific application, component, program, object, module, or sequence of instructions (collectively referred to as "computer programs"). The computer programs typically comprise one or more instructions (e.g., instructions 604, 608, 628) set at various times in various memory and storage devices in computing device(s). When read and executed by the processor 602, the instruction(s) cause the computing system 600 to perform operations to execute elements involving the various aspects of the disclosure.

AI/ML Models

To assist in understanding the present disclosure, some concepts relevant to neural networks and machine learning (ML) are discussed herein. In the present disclosure, the term "ML-based model" or more simply "ML model" or "model" may be understood to refer to an algorithm that is trained to complete a certain task or model a certain target behavior. Training an ML model refers to a process of learning the values of certain parameters such that the ML model is able to model the target behavior to a desired degree of accuracy. Training typically requires the use of a training dataset, which is a set of data that is relevant to the target behavior of the ML model.

One example of an ML model is a neural network. Generally, a neural network comprises a number of computation units (sometimes referred to as "neurons"). Each neuron receives an input value and applies a function to the input to generate an output value. The function typically includes a parameter (also referred to as a "weight") whose value is learned through the process of training. A plurality of neurons may be organized into a neural network layer (or simply "layer") and there may be multiple such layers in a neural network. The output of one layer may be provided as input to a subsequent layer. Thus, input to a neural network may be processed through a succession of layers until an output of the neural network is generated by a final layer. This is a simplistic discussion of neural networks and there may be more complex neural network designs that include feedback connections, skip connections, and/or other such possible connections between neurons and/or layers, which are not discussed in detail here. Training a neural network model involves learning the values of the parameters (i.e., the weights) of the neurons in the layers such that the neural network model is able to model the target behavior to a desired degree of accuracy.

A deep neural network (DNN) is a type of neural network having multiple layers and/or a large number of neurons. The term DNN may encompass any neural network having multiple layers, including convolutional neural networks (CNNs), recurrent neural networks (RNNs), multilayer perceptrons (MLPs), Generative Adversarial Networks (GANs), Variational Autoencoders (VAEs), Stable Diffusion, ControlNet, and Auto-regressive Models, among others. DNNs are often used as ML-based models for modeling complex behaviors (e.g., human language, image recognition, object classification) in order to improve the accuracy of outputs (e.g., more accurate predictions) such as, for example, as compared with models with fewer layers.

Unlike discriminative models, generative models are distinguished by their ability to create new, synthetic data that closely resembles the training data. In contrast, discriminative models focus on predicting labels for given inputs. This makes them particularly valuable for applications requiring data augmentation, creative content generation (such as images and video), and simulation. Examples of generative models include Generative Adversarial Networks (GANs) and Variational Autoencoders (VAEs), generative LLMs, diffusion models, and multimodal models. GANs operate through a dynamic interplay between a generator, which creates data, and a discriminator, which evaluates its authenticity. VAEs, in contrast, encode data into a latent space and decode it to produce new samples. The training of generative models involves optimizing their parameters to enhance the realism and diversity of the generated outputs, thereby expanding the potential for innovation in various fields.

As an example, to train an ML model that is intended to model human language (also referred to as a language model), the training dataset may be a collection of text documents referred to as a text corpus (or simply referred to as a corpus). The corpus may represent a language domain (e.g., a single language), a subject domain (e.g., scientific papers), and/or may encompass another domain or domains, be they larger or smaller than a single language or subject domain. For example, a relatively large, multilingual and non-subject-specific corpus may be created by extracting text from online web pages and/or publicly available social media posts. Training data may be annotated with ground truth labels (e.g., each data entry in the training dataset may be paired with a label) or may be unlabeled.

Training an ML model generally involves inputting into an ML architecture (e.g., an untrained ML model) training data to be processed by the ML model, processing the training data using the ML model, collecting the output generated by the ML model (e.g., based on the inputted training data), and comparing the output to a desired set of target values. If the training data is labeled, the desired target values may be, e.g., the ground truth labels of the training data. An example of labeled training data is an image labeled by text describing aspects of the image; such data can be used in models that generate text descriptions of images, or in models that use text to generate images. If the training data is unlabeled, the desired target value may be a reconstructed (or otherwise processed) version of the corresponding ML model input (e.g., in the case of an autoencoder), or can be a measure of some target observable effect on the environment (e.g., in the case of a reinforcement learning agent). The parameters of the ML model are updated based on a difference between the generated output value and the desired target value. For example, if the value outputted by the ML model is excessively high, the parameters may be adjusted so as to lower the output value in future training iterations. An objective function is a way to quantitatively represent how close the output value is to the target value. An objective function represents a quantity (or one or more quantities) to be optimized (e.g., minimize a loss or maximize a reward) in order to bring the output value as close to the target value as possible. The goal of training the ML model typically is to minimize a loss function or maximize a reward function.

The training data may be a subset of a larger data set. For example, a data set may be split into three mutually exclusive subsets: a training set, a validation (or cross-validation) set, and a testing set. The three subsets of data may be used sequentially during ML model training. For example, the training set may be first used to train one or more ML models, each ML model, e.g., having a particular architecture, having a particular training procedure, being describable by a set of model hyperparameters, and/or otherwise being varied from the other of the one or more ML models. The validation (or cross-validation) set may be used as input data into the trained ML models to, e.g., measure the performance of the trained ML models and/or compare performance between them. Where hyperparameters are used, a new set of hyperparameters may be determined based on the measured performance of one or more of the trained ML models, and the first step of training (i.e., with the training set) may begin again on a different ML model described by the new set of determined hyperparameters. In this way, these steps may be repeated to produce a more performant trained ML model. Once such a trained ML model is obtained (e.g., after the hyperparameters have been adjusted to achieve a desired level of performance), a third step of collecting the output generated by the trained ML model applied to the third subset (the testing set) may begin. The output generated from the testing set may be compared with the corresponding desired target values to give a final assessment of the trained ML model's accuracy. Other segmentations of the larger data set and/or schemes for using the segments for training one or more ML models are possible.

Backpropagation is an algorithm that can be used for training some ML model. Backpropagation is used to adjust (also referred to as update) the value of the parameters in the ML model, with the goal of optimizing the objective function. For example, a defined loss function is calculated by forward propagation of an input to obtain an output of the ML model and a comparison of the output value with the target value. Backpropagation calculates a gradient of the loss function with respect to the parameters of the ML model, and a gradient algorithm (e.g., gradient descent) is used to update (i.e., "learn") the parameters to reduce the loss function. Backpropagation is performed iteratively so that the loss function is converged or minimized. Other techniques for learning the parameters of the ML model may be used. The process of updating (or learning) the parameters over many iterations is referred to as training. Training may be carried out iteratively until a convergence condition is met (e.g., a predefined maximum number of iterations has been performed, or the value outputted by the ML model is sufficiently converged with the desired target value), after which the ML model is considered to be sufficiently trained. The values of the learned parameters may be fixed and the ML model may be deployed to generate output in real-world applications (also referred to as "inference").

In some examples, a trained ML model may be fine-tuned, meaning that the values of the learned parameters may be adjusted slightly in order for the ML model to better model a specific task. Fine-tuning of an ML model typically involves further training the ML model on a number of data samples (which may be smaller in number/cardinality than those used to train the model initially) that closely target the specific task. For example, an ML model for generating natural language that has been trained generically on publicly available text corpora may be, e.g., fine-tuned by further training using specific training samples. The specific training samples can be used to generate language in a certain style or in a certain format. For example, the ML model can be trained to generate a blog post having a particular style and structure with a given topic.

Some concepts in ML-based language models are now discussed. It may be noted that, while the term "language model" has been commonly used to refer to a ML-based language model, there could exist non-ML language models. In the present disclosure, the term "language model" may be used as shorthand for an ML-based language model (i.e., a language model that is implemented using a neural network or other ML architecture), unless stated otherwise. For example, unless stated otherwise, the "language model" encompasses LLMs.

A language model may use a neural network (typically a DNN) to perform NLP tasks. A language model may be trained to model how words relate to each other in a textual sequence, based on probabilities. A language model may contain hundreds of thousands of learned parameters or in the case of a large language model (LLM) may contain millions or billions of learned parameters or more. As non-limiting examples, a language model can generate text, translate text, summarize text, answer questions, write code (e.g., Phyton, JavaScript, or other programming languages), classify text (e.g., to identify spam emails), create content for various purposes (e.g., social media content, factual content, or marketing content), or create personalized content for a particular individual or group of individuals. Language models can also be used for chatbots (e.g., virtual assistance).

In recent years, there has been interest in a type of neural network architecture, referred to as a transformer, for use as language models. For example, the Bidirectional Encoder Representations from Transformers (BERT) model, the Transformer-XL model, and the Generative Pre-trained Transformer (GPT) models are types of transformers. A transformer is a type of neural network architecture that uses self-attention mechanisms in order to generate predicted output based on input data that has some sequential meaning (i.e., the order of the input data is meaningful, which is the case for most text input). Although transformer-based language models are described herein, it should be understood that the present disclosure may be applicable to any ML-based language model, including language models based on other neural network architectures such as RNN-based language models.

Figure 7:
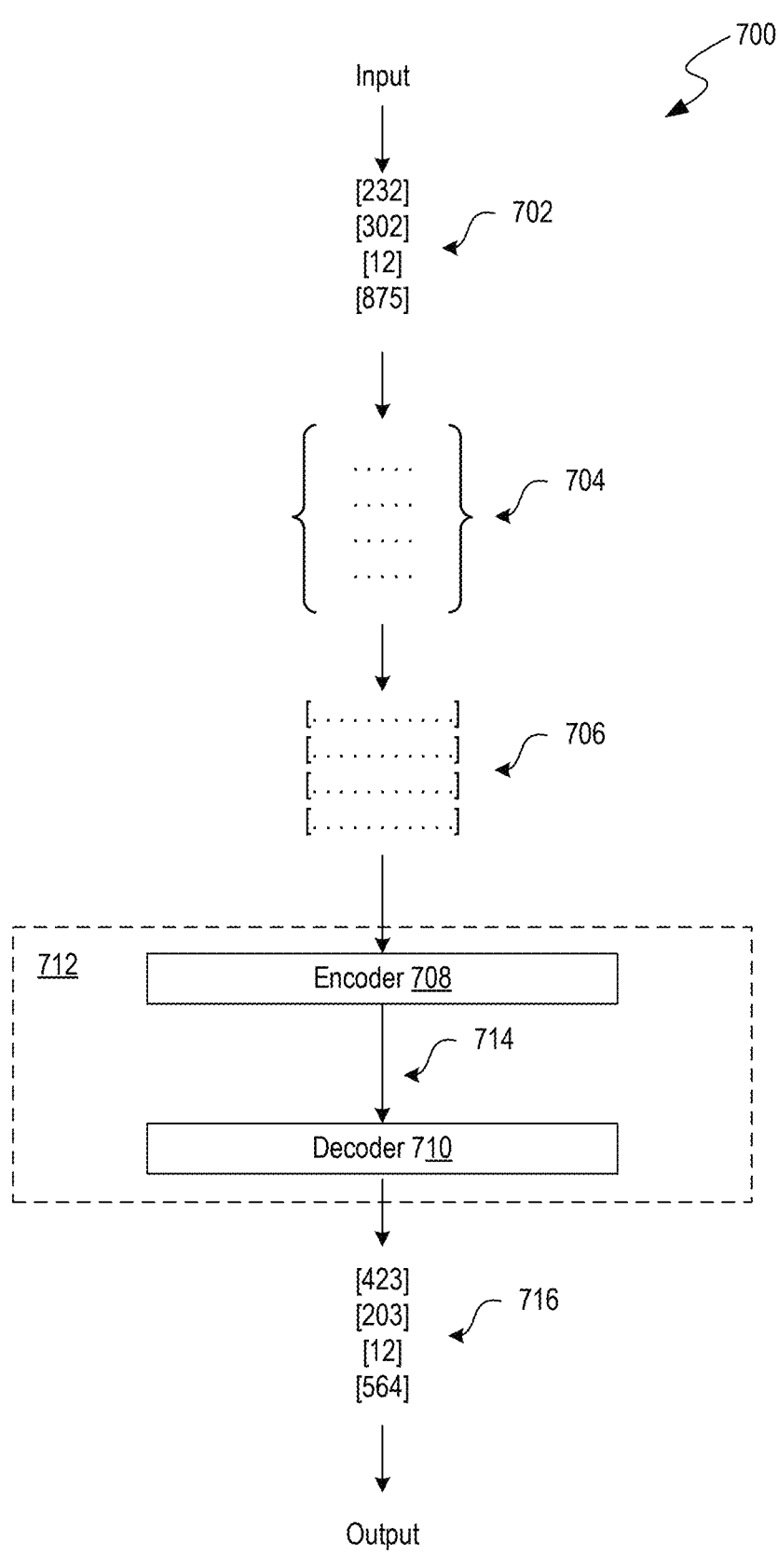
FIG. 7 is a block diagram of an artificial intelligence (AI)/machine learning (ML) model such as those on which at least some operations described herein can be implemented.

FIG. 7 is a block diagram 700 of an example transformer 712. A transformer is a type of neural network architecture that uses self-attention mechanisms to generate predicted output based on input data that has some sequential meaning (i.e., the order of the input data is meaningful, which is the case for most text input). Self-attention is a mechanism that relates different positions of a single sequence to compute a representation of the same sequence. Although transformer-based language models are described herein, it should be understood that the present disclosure may be applicable to any machine learning (ML)-based language model, including language models based on other neural network architectures such as RNN-based language models.

The transformer 712 includes an encoder 708 (which can comprise one or more encoder layers/blocks connected in series) and a decoder 710 (which can comprise one or more decoder layers/blocks connected in series). Generally, the encoder 708 and the decoder 710 each include a plurality of neural network layers, at least one of which can be a self-attention layer. The parameters of the neural network layers can be referred to as the parameters of the language model.

The transformer 712 can be trained to perform certain functions on a natural language input. For example, the functions include summarizing existing content, brainstorming ideas, writing a rough draft, fixing spelling and grammar, and translating content. Summarizing can include extracting key points from an existing content in a high-level summary. Brainstorming ideas can include generating a list of ideas based on provided input. For example, the ML model can generate a list of names for a startup or costumes for an upcoming party. Writing a rough draft can include generating writing in a particular style that could be useful as a starting point for the user's writing. The style can be identified as, e.g., an email, a blog post, a social media post, or a poem. Fixing spelling and grammar can include correcting errors in an existing input text. Translating can include converting an existing input text into a variety of different languages. In some embodiments, the transformer 712 is trained to perform certain functions on other input formats than natural language input. For example, the input can include objects, images, audio content, or video content, or a combination thereof.

The transformer 712 can be trained on a text corpus that is labeled (e.g., annotated to indicate verbs, nouns) or unlabeled. Large language models (LLMs) can be trained on a large unlabeled corpus. The term "language model," as used herein, can include an ML-based language model (e.g., a language model that is implemented using a neural network or other ML architecture), unless stated otherwise. Some LLMs can be trained on a large multi-language, multi-domain corpus to enable the model to be versatile at a variety of language-based tasks such as generative tasks (e.g., generating human-like natural language responses to natural language input). FIG. 7 illustrates an example of how the transformer 712 can process textual input data. Input to a language model (whether transformer-based or otherwise) typically is in the form of natural language that can be parsed into tokens. It should be appreciated that the term "token" in the context of language models and NLP has a different meaning from the use of the same term in other contexts such as data security. Tokenization, in the context of language models and NLP, refers to the process of parsing textual input (e.g., a character, a word, a phrase, a sentence, a paragraph) into a sequence of shorter segments that are converted to numerical representations referred to as tokens (or "compute tokens"). Typically, a token can be an integer that corresponds to the index of a text segment (e.g., a word) in a vocabulary dataset. Often, the vocabulary dataset is arranged by frequency of use. Commonly occurring text, such as punctuation, can have a lower vocabulary index in the dataset and thus be represented by a token having a smaller integer value than less commonly occurring text. Tokens frequently correspond to words, with or without white space appended. In some examples, a token can correspond to a portion of a word.

For example, the word "greater" can be represented by a token for [great] and a second token for [er]. In another example, the text sequence "write a summary" can be parsed into the segments [write], [a], and [summary], each of which can be represented by a respective numerical token. In addition to tokens that are parsed from the textual sequence (e.g., tokens that correspond to words and punctuation), there can also be special tokens to encode non-textual information. For example, a [CLASS] token can be a special token that corresponds to a classification of the textual sequence (e.g., can classify the textual sequence as a list, a paragraph), an [EOT] token can be another special token that indicates the end of the textual sequence, other tokens can provide formatting information, etc.

In FIG. 7, a short sequence of tokens 702 corresponding to the input text is illustrated as input to the transformer 712. Tokenization of the text sequence into the tokens 702 can be performed by some pre-processing tokenization module such as, for example, a byte-pair encoding tokenizer (the "pre" referring to the tokenization occurring prior to the processing of the tokenized input by the LLM), which is not shown in FIG. 7 for simplicity. In general, the token sequence that is inputted to the transformer 712 can be of any length up to a maximum length defined based on the dimensions of the transformer 712. Each token 702 in the token sequence is converted into an embedding vector 706 (also referred to simply as an embedding 706). An embedding 706 is a learned numerical representation (such as, for example, a vector) of a token that captures some semantic meaning of the text segment represented by the token 702. The embedding 706 represents the text segment corresponding to the token 702 in a way such that embeddings corresponding to semantically related text are closer to each other in a vector space than embeddings corresponding to semantically unrelated text. For example, assuming that the words "write," "a," and "summary" each correspond to, respectively, a "write" token, an "a" token, and a "summary" token when tokenized, the embedding 706 corresponding to the "write" token will be closer to another embedding corresponding to the "jot down" token in the vector space as compared to the distance between the embedding 706 corresponding to the "write" token and another embedding corresponding to the "summary" token.

The vector space can be defined by the dimensions and values of the embedding vectors. Various techniques can be used to convert a token 702 to an embedding 706. For example, another trained ML model can be used to convert the token 702 into an embedding 706. In particular, another trained ML model can be used to convert the token 702 into an embedding 706 in a way that encodes additional information into the embedding 706 (e.g., a trained ML model can encode positional information about the position of the token 702 in the text sequence into the embedding 706). In some examples, the numerical value of the token 702 can be used to look up the corresponding embedding in an embedding matrix 704 (which can be learned during training of the transformer 712).

The generated embeddings 706 are input into the encoder 708. The encoder 708 serves to encode the embeddings 706 into feature vectors 714 that represent the latent features of the embeddings 706. The encoder 708 can encode positional information (i.e., information about the sequence of the input) in the feature vectors 714. The feature vectors 714 can have very high dimensionality (e.g., on the order of thousands or tens of thousands), with each element in a feature vector 714 corresponding to a respective feature. The numerical weight of each element in a feature vector 714 represents the importance of the corresponding feature. The space of all possible feature vectors 714 that can be generated by the encoder 708 can be referred to as the latent space or feature space.

Conceptually, the decoder 710 is designed to map the features represented by the feature vectors 714 into meaningful output, which can depend on the task that was assigned to the transformer 712. For example, if the transformer 712 is used for a translation task, the decoder 710 can map the feature vectors 714 into text output in a target language different from the language of the original tokens 702. Generally, in a generative language model, the decoder 710 serves to decode the feature vectors 714 into a sequence of tokens. The decoder 710 can generate output tokens 716 one by one. Each output token 716 can be fed back as input to the decoder 710 in order to generate the next output token 716. By feeding back the generated output and applying self-attention, the decoder 710 is able to generate a sequence of output tokens 716 that has sequential meaning (e.g., the resulting output text sequence is understandable as a sentence and obeys grammatical rules). The decoder 710 can generate output tokens 716 until a special [EOT] token (indicating the end of the text) is generated. The resulting sequence of output tokens 716 can be converted to a text sequence in post-processing. For example, each output token 716 can be an integer number that corresponds to a vocabulary index. By looking up the text segment using the vocabulary index, the text segment corresponding to each output token 716 can be retrieved, the text segments can be concatenated together, and the final output text sequence can be obtained.

In some examples, the input provided to the transformer 712 includes instructions to perform a function on an existing text. In some examples, the input provided to the transformer includes instructions to perform a function on an existing text. The output can include, for example, a modified version of the input text and instructions to modify the text. The modification can include summarizing, translating, correcting grammar or spelling, changing the style of the input text, lengthening or shortening the text, or changing the format of the text. For example, the input can include the question "What is the weather like in Australia?" and the output can include a description of the weather in Australia.

Although a general transformer architecture for a language model and its theory of operation have been described above, this is not intended to be limiting. Existing language models include language models that are based only on the encoder of the transformer or only on the decoder of the transformer. An encoder-only language model encodes the input text sequence into feature vectors that can be further processed by a task-specific layer (e.g., a classification layer). BERT is an example of a language model that can be considered to be an encoder-only language model. A decoder-only language model accepts embeddings as input and can use auto-regression to generate an output text sequence. Transformer-XL and GPT-type models can be language models that are considered to be decoder-only language models.

Because GPT-type language models tend to have a large number of parameters, these language models can be considered LLMs. An example of a GPT-type LLM is GPT-3. GPT-3 is a type of GPT language model that has been trained (in an unsupervised manner) on a large corpus derived from documents available to the public online. GPT-3 has a very large number of learned parameters (on the order of hundreds of billions), is able to accept a large number of tokens as input (e.g., up to 2,048 input tokens), and is able to generate a large number of tokens as output (e.g., up to 2,048 tokens). GPT-3 has been trained as a generative model, meaning that it can process input text sequences to predictively generate a meaningful output text sequence. ChatGPT is built on top of a GPT-type LLM and has been fine-tuned with training datasets based on text-based chats (e.g., chatbot conversations). ChatGPT is designed for processing natural language, receiving chat-like inputs, and generating chat-like outputs.

A computer system can access a remote language model (e.g., a cloud-based language model), such as ChatGPT, GPT-3, GPT-4, etc. via a software interface (e.g., an API). Additionally or alternatively, such a remote language model can be accessed via a network such as, for example, the Internet. In some implementations, such as, for example, potentially in the case of a cloud-based language model, a remote language model can be hosted by a computer system that can include a plurality of cooperating (e.g., cooperating via a network) computer systems that can be in, for example, a distributed arrangement. Notably, a remote language model can employ a plurality of processors (e.g., hardware processors such as, for example, processors of cooperating computer systems). Indeed, processing of inputs by an LLM can be computationally expensive/can involve a large number of operations (e.g., many instructions can be executed/large data structures can be accessed from memory), and providing output in a required timeframe (e.g., real time or near real time) can require the use of a plurality of processors/cooperating computing devices as discussed above.

Inputs to an LLM can be referred to as a prompt, which is a natural language input that includes instructions to the LLM to generate a desired output. A computer system can generate a prompt that is provided as input to the LLM via its API. As described above, the prompt can optionally be processed or pre-processed into a token sequence prior to being provided as input to the LLM via its API. A prompt can include one or more examples of the desired output, which provides the LLM with additional information to enable the LLM to generate output according to the desired output. Additionally or alternatively, the examples included in a prompt can provide inputs (e.g., example inputs) corresponding to/as can be expected to result in the desired outputs provided. A one-shot prompt refers to a prompt that includes one example, and a few-shot prompt refers to a prompt that includes multiple examples. A prompt that includes no examples can be referred to as a zero-shot prompt.

EXAMPLE EMBODIMENTS

Figure 8:
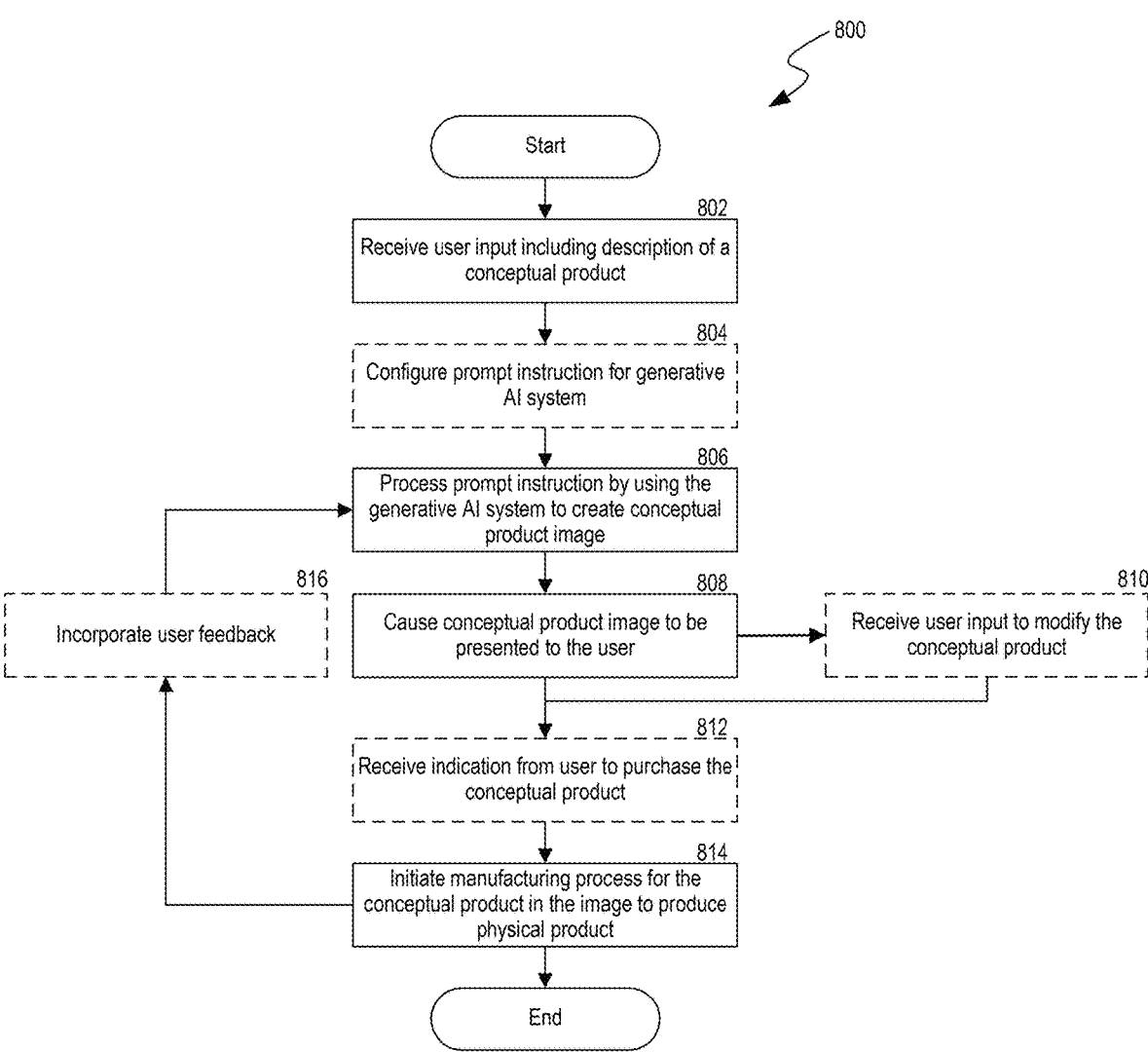
FIG. 8 is a flowchart for a method of generating an image, in response to user input, of a physically producible product that is immediately purchasable.

FIG. 8 is a flowchart for a method 800 of generating an image, in response to user input, of a physically producible product that is immediately purchasable. The method 800 can be performed by a system with components as described earlier in this document.

At 802, the system receives user input including at least one of natural language text, natural language speech, or an image entered into a user interface. The input can include an unstructured description of a conceptual product, where the unstructured description lacks a specific format. The images can include photographs of real-world scenes or documentation, hand-drawn or digitally created illustrations, diagrams, flowcharts, or the like.

At 804, the system optionally configures, based on the natural language text, the natural language speech, or the image entered into the user interface, a prompt instruction for a generative AI system. In some embodiments, the generative AI system includes models that are trained using a combination of real-world data and synthetic data created by humans or AI image-generating models. In one example, configuring the prompt instruction for the generative AI system includes preprocessing the user input to create the prompt instruction for the AI system, where the prompt instruction is configured to cause the generative AI system to generate multiple images representing different manufacturable versions of the conceptual product. In one example, preprocessing the user input to create the prompt instruction for the AI system includes analyzing manufacturability constraints of producing the physical product based on a model of products including the conceptual product and configuring the prompt instruction such that different manufacturable versions of the conceptual product satisfy the manufacturability constraints. The operation 804 is optional because the generative AI system can receive a prompt instruction directly from the user without the preprocessing of operation 804.

At 806, the system processes the prompt instruction with the generative AI system to generate an image that includes a version of the conceptual product. The version of the conceptual product is nonexistent and producible to a physical product. In some embodiments, the system generates multiple images that are distinctly selectable on the user interface for initiating a process to manufacture the physical product in accordance with different versions of the conceptual product. In some embodiments, the system extracts, from the image, multiple physical attributes of the conceptual product, where the multiple physical attributes include volume, weight, dimensions, or materials for manufacturing the physical product. Processing the prompt instruction with the generative AI system can include determining a price for the version of the conceptual product based on an analysis of the extracted physical attributes, where the physical attributes include the volume, weight, dimensions, or materials. In one example, the conceptual product is a jewelry item, where the generative AI system is trained to generate images of types of jewelry with physical attributes that include a design and/or material specification.

At 808, the system causes the user interface to present the image including a representation of the version of the conceptual product. The version of the conceptual product has a physical attribute of the physical product, and the conceptual product has an associated unique identifier (e.g., SKU) that is created in association with the version of the conceptual product. In some embodiments, the system can create multiple unique identifiers for different versions of the conceptual product, where the unique identifiers are different from each other. As such, the system causes the user interface to present multiple images including different representations of the conceptual product and accompanying alternative unique identifiers.

At 810, the system can optionally allow the user to iteratively modify the conceptual product. In one example, the system receives another user input, which is used to configure another prompt instruction for the generative AI system to generate another image that includes a new version of the conceptual product. The new version is a modification of the prior version of the conceptual product. As such, the user interface presents a new image including a representation of the modified version of the conceptual product, including a new or different unique identifier different (e.g., a different SKU).

In one example, the system includes a remix feature configured to generate a new version of a conceptual product that is derived from the prior version of the product. As such, the two versions share common aspects but are distinctly different and have different SKUs. The new version can be generated based on additional input from the user (e.g., request a specific change) or the changes relative to the prior version can be generated randomly to provide options to a conceptual product with common features.

At 812, the system optionally receives an indication by the user to purchase the conceptual product. In response to the indication of the purchase, the system initiates a process to produce the physical product based on the version of the conceptual product in accordance with the physical attribute and in association with the unique identifier. In some embodiments, the system receives an indication of a selection from among multiple images presented on the user interface.

At 814, in response to the indication to purchase the conceptual product, the system can initiate a process to produce the physical product based on the version of the conceptual product in the selected image, in accordance with any physical attributes, and in association with the second unique identifier.

At 816, the system can incorporate user feedback of the image or the actual product into a data pipeline used to improve the generative AI system, where the feedback includes indications of aesthetic qualities, accuracy of one or more images, or comparisons to an actual completed product.

Figure 9:
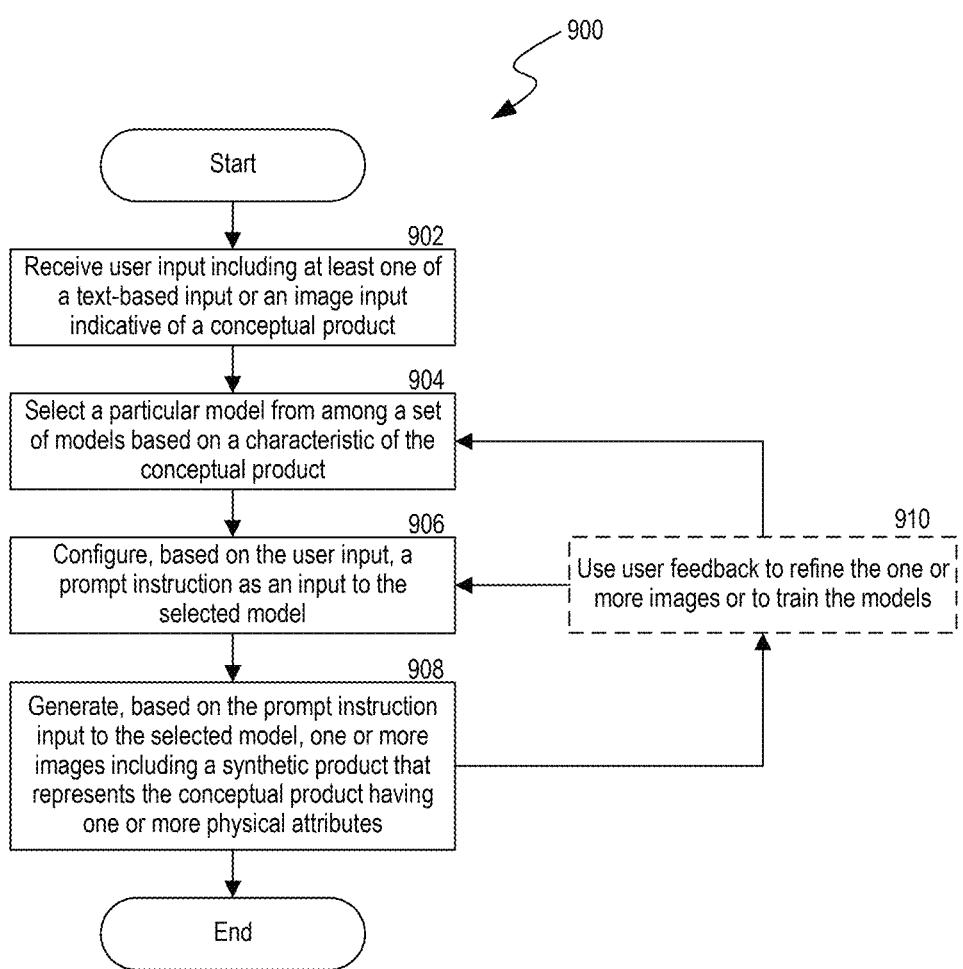
FIG. 9 is a flowchart that illustrates a method for preprocessing user inputs for models that are for specific manufacturers or product categories.

FIG. 9 is a flowchart that illustrates a method for preprocessing user inputs for models that are trained to generate images of synthetic products for specific manufacturers or product categories. The method 900 can be performed by a system with components as described in this document to preprocess user input for an AI system configured to generate an image of a synthetic product that represents a conceptual product.

At 902, the system receives user input including at least one of a text-based input or an image input indicative of a conceptual product. The input can be processed by an AI system that includes one or more generative models (e.g., ML models with generative capabilities) that are configured to generate images based on the user input, where the images are of synthetic products that represent conceptual products and that are manufacturable (e.g., products that are artificial or do not necessarily exist).

At 904, the system selects a particular generative model from among a set of generative models based on a characteristic of the conceptual product. In one example, each generative model is configured to generate images of conceptual products for different categories of products. In the illustrated example, the particular generative model is configured to generate one or more images of a synthetic product that represents the conceptual product in accordance with its characteristic. The model can be selected based on a physical characteristic of the conceptual product including a product category, an intended use of the conceptual product, and/or a target user of the conceptual product.

In one implementation, the system determines that the characteristic of the conceptual product is indicative of a particular category of products and identifies a type of maker of the category of products or a particular maker of products based on the characteristic of the conceptual product. The particular model can thus be configured to generate the images of the conceptual product for the particular category of products by the particular maker of products or for different makers of products.

At 906, the system configures, based on the user input, a prompt instruction (e.g., text-based prompt instruction) as an input to the selected model. The prompt instruction is configured to direct an output of the selected model in accordance with the characteristic of the conceptual product. In an example, the image input includes an object, and the system converts the image input into a text-based representation including a description of the object. The system combines the text-based input and the text-based representation of the image input into a description of the conceptual product included in the prompt instruction.

The system can also incorporate constraints (e.g., manufacturability constraints) into the prompt instruction. The system can analyze constraints associated with creation of a physical version of the conceptual product and then configure wording of the prompt based on the constraints. Examples of manufacturability constraints include a material constraint, a production constraint, and/or a cost constraint.

In another example, the system recognizes a known object included in an image input and converts the image input into a text-based representation of an unknown object that corresponds to a modified version of the known object. A description of the conceptual product is generated based on the text-based representation of the unknown object. As such, the system avoids generating a synthetic product that is used to manufacture an identical copy of a product in an image, which can be undesired in some instances. The prompt instruction is then generated based on the description of the conceptual product including the description of the unknown object.

At 908, the system generates, based on the prompt instruction input to the selected model, the images including the synthetic product that represents the conceptual product having one or more physical attributes. The images can be presented on a user interface as products that are immediately purchasable.

At 910, the system can optionally receive user feedback of images of the conceptual product. The feedback can be used to improve the accuracy of the models used to generate the images and/or to refine the images of the conceptual product. That is, the user feedback can be incorporated into a prompt instruction so that images of the conceptual product are refined accordingly.

Figure 10:
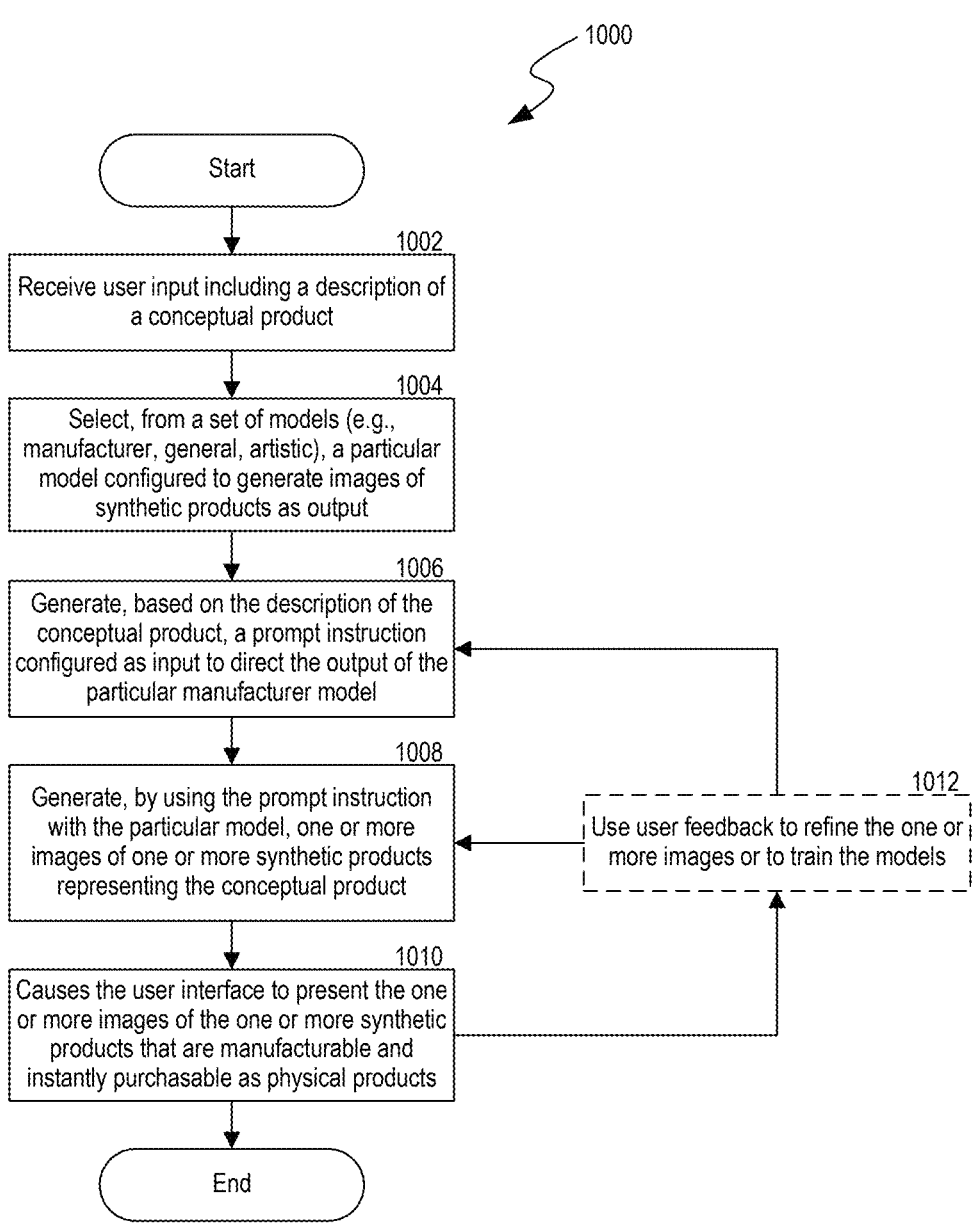
FIG. 10 is a flowchart that illustrates a method for generating images of synthetic products that are manufacturable as physical products.

FIG. 10 is a flowchart that illustrates a method for generating images of synthetic products that are instantaneously manufacturable as physical products. The method 1000 can be performed by a system with components as described in this document to perform a process for manufacturing synthetic products as physical products in the real world.

At 1002, the system receives user input including a description of a conceptual product entered at a user interface. In one example, the system causes a user interface to present a control configured to receive the user input, which can include at least one of a text-based input or an image input.

At 1004, the system selects, from a set of manufacturer models, a particular manufacturer model configured to generate images of synthetic products as output. The manufacturer model can be a type of generative model that is used to generate images of synthetic products that can be physically produced by one or more specific manufacturers. In one example, a particular manufacturer model is trained for the particular manufacturer based on one or more data pipelines including user feedback, published images of products with descriptions, and/or images supplied by the particular manufacturer.

In one example, the system can determine that the conceptual product belongs to a category of products and that a first manufacturer model is associated with a first set of manufacturer constraints for physically manufacturing the category of products. The system can determine that a second manufacturer model is associated with a second set of manufacturer constraints, which is more restrictive than the first set of manufacturing constraints. As such, the first manufacturer model would be selected over the second.

At 1006, the system generates, based on the description of the conceptual product, a prompt instruction (e.g., text-based prompt instruction) configured as input to direct the output of the particular manufacturer model. The system can also analyze a manufacturability constraint associated with creation of a physical product based on a synthetic product of the conceptual product and incorporate an indication of the manufacturability constraint into the prompt instruction.

At 1008, the system generates, by using the prompt instruction with the particular manufacturer model, one or more images of one or more synthetic products representing the conceptual product. In one example, the system generates a text-based description of an object in the image and combines, or augments, the text-based input of the user input and the text-based description of the object in the image input as a description of the conceptual product, where the text-based prompt includes the description of the conceptual product. The system can also generate images of synthetic products to conform with the one or more manufacturing constraints. Examples of the manufacturing constraints include constraints on equipment, material, or cost.

The system can generate multiple images of one synthetic product or generate multiple images of different synthetic products, where each synthetic product is manufacturable by a manufacturer in accordance with a manufacturer model that is trained for that manufacturer. In one example, the system determines that the conceptual product belongs to a category of products, where a manufacturer model is specific to a product category such that synthetic products included in images for the particular manufacturer model are constrained by physical attributes of products that are in the product category.

At 1010, the system causes the user interface to present the one or more images of the one or more synthetic products representing the conceptual product. The synthetic products depicted in the images are manufacturable by the particular manufacturer into physical products that are immediately purchasable upon presentation of the images on the user interface. The system can cause the user interface to present the image of the synthetic product representing the conceptual product, where the image of the synthetic product is presented along with a purchase price and expected delivery date. In one example, the user interface is caused to present images of different synthetic products that each represent the conceptual product, where each image is associated with a purchase price or cost and a time parameter for completing manufacturing or delivery of the physical products.

At 1012, the system can optionally receive user feedback of images of the conceptual product. The feedback can be used to improve the accuracy of the models used to generate the images and/or to refine the images of the conceptual product. That is, the user feedback can be incorporated into a prompt instruction so that images of the conceptual product are refined accordingly. The system can also optionally process each of the images with a quality assurance (QA) algorithm configured to assess metrics including reliability relative to the prompt, design quality, and/or image defects. The set of manufacturer models can be trained based on the assessment of the metrics.

Figure 11:
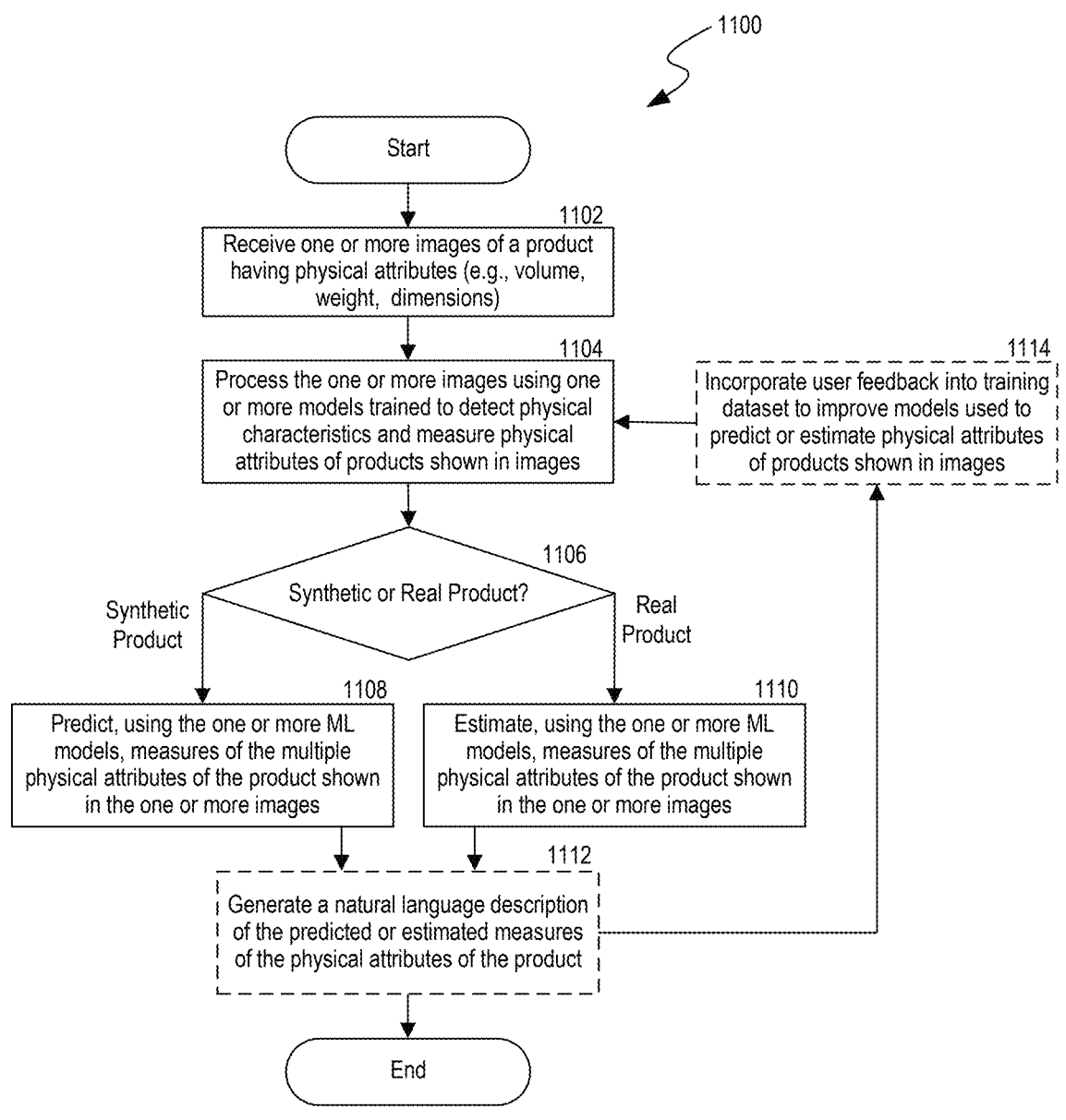
FIG. 11 is a flowchart that illustrates a method for predicting or estimating physical attributes of products shown in images.

FIG. 11 is a flowchart that illustrates a method for predicting or estimating physical attributes of products shown in images. The method 1100 can be performed by a system with components (memory storing instructions, hardware processors executing the instructions, etc.) as described in this document to predict or estimate the physical attributes of real or synthetic products shown in images.

At 1102, the system receives one or more images of the product. The images of the product have different physical attributes. In one example, different images of the product show different physical attributes of the product. In one example, the images that show the product are photographs captured of a real-world product. In another example, the images are generated of synthetic products as described elsewhere in this document.

At 1104, the system processes the images using an artificial intelligence system that includes one or more models that are trained on images of products with multiple or different physical attributes. In one example, the models are trained with datasets including photographs of real-world products and images of synthetic products with known physical characteristics of a category of products. The models can be trained to detect physical characteristics and measures of physical attributes of products shown in images, where the physical characteristics are distinguishable features of products shown in images.

In one implementation, the system can identify a product category for the product based on the detected physical characteristics of the product and select one or more ML models from among multiple models configured to predict or estimate physical attributes for different product categories. The selected ML models are configured to predict or estimate physical attributes of products in the product category.

At 1106, the system predicts or estimates, depending on whether the product is synthetic or real, respectively, the physical attributes of the product. Examples of the physical attributes include volume, weight, and dimensions of at least a portion of the product.

When the product is synthetic, at 1108, the models are used to predict measures of physical attributes of the synthetic product shown in the images. For example, the system could have received user input including a description of a conceptual product entered to a user interface, which is used to generate the images as an output of a generative model based on a prompt including the description of the conceptual product. In this example, the product shown in the images is thus a synthetic product that represents the conceptual product, and measures of the multiple physical attributes of the synthetic product shown are predicted by the models.

On the other hand, when the product is real, at 1110, the system uses the models to estimate measures of the physical attributes. For example, the system could have received user input including photographs of the real-world product uploaded via the user interface. The measures of the multiple physical attributes of the real-world product shown in the photographs are thus estimated by the models.

At 1112, the system optionally generates, using a generative model, a natural language description of the predicted or estimated measures of the physical attributes of the product. The system can cause the user interface to present the natural language description of the predicted or estimated measures of the physical attributes including measures for the volume, the weight, and/or the dimensions of at least a portion of the product.

At 1114, the system optionally receives user feedback regarding the predicted or estimated product attributes of the product and incorporates the user feedback into a training dataset configured to improve an accuracy of the models in predicting or estimating physical attributes of products shown in images.

Figure 12:
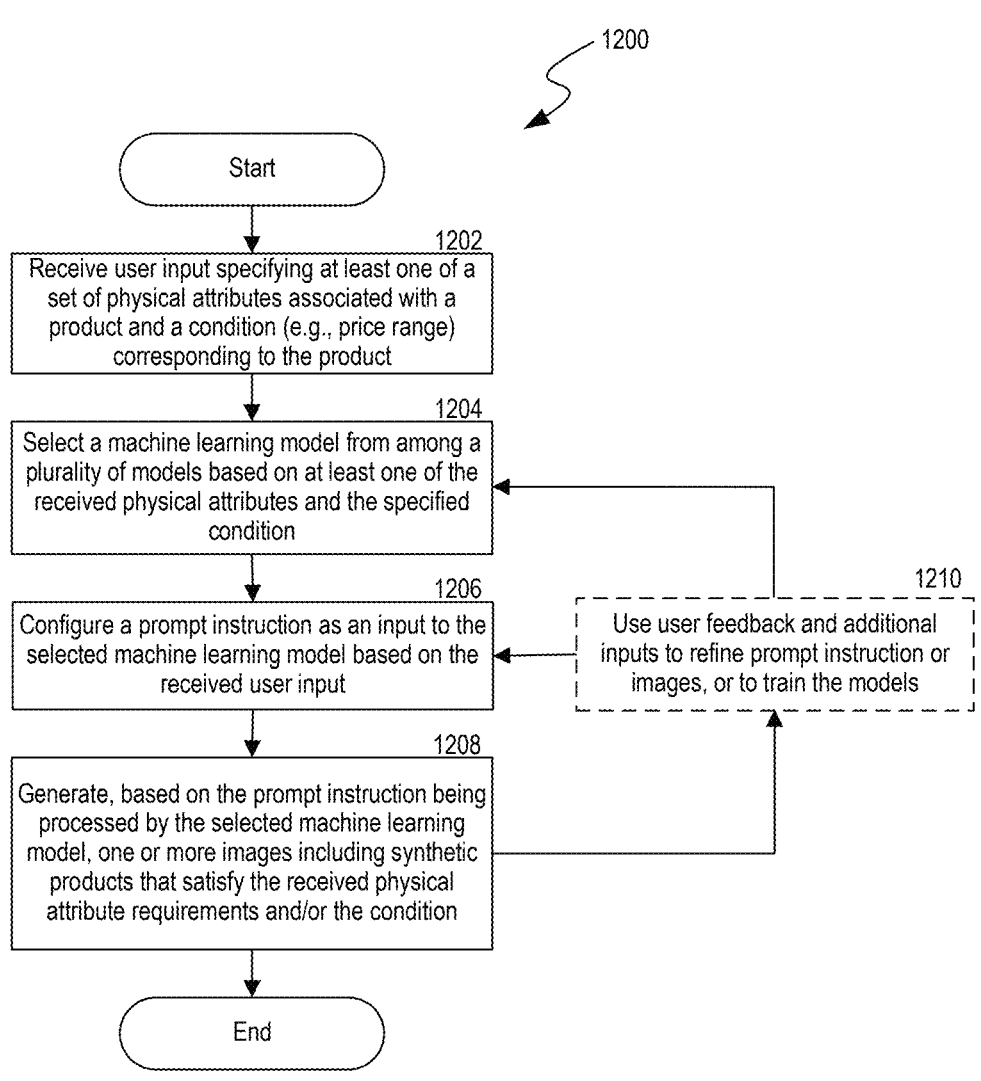
FIG. 12 is a flowchart that illustrates a process to generate images of conceptual products based on an initial input that has a limited scope.

FIG. 12 is a flowchart that illustrates a process 1200 to create images of conceptual products based on an initial input that has a limited scope. The initial input can exclude details, allowing the output to cover numerous potential conceptual products. For example, the input can specify an attribute or condition defining a feature of a conceptual product that includes various possible products. These attributes can be subjective, such as aesthetic appeal or personal style, or objective, like material composition or historical significance. For instance, a piece of jewelry may be described by its color, shape, metal type, gemstone, or design style. An example of a condition might include a price or expected delivery date for the real-world product based on the conceptual product. The condition can be defined in the input by a range of values, such as a price range or delivery date range. Additionally, the user input may include a product category or leave the category unspecified. For example, a user can indicate that they are seeking a gift and describe certain details without specifying a particular product category.

At 1202, the system receives user input specifying at least one attribute or condition for a product. In one example, the initial input includes a set of physical attributes or a price range for the product. The initial input can include text or attributes or conditions selected from a menu. For example, a user interface administered by the system can present controls for selecting a product category, attribute, and condition, such as checkboxes for selecting jewelry as a product category and gold as an attribute, and a slider bar for setting a price range for a condition. For instance, the user could specify "necklace" as the category, "emerald" as the gemstone, and "$100-$200" as the price range.

At 1204, the system selects one or more models from among multiple models based on the initial input. The system can choose a model from among a set of models for different product categories, attributes, or conditions. For example, a model could be selected for jewelry or furniture based on the initial input. The models can be trained on initial inputs with limited scopes or trained as indicated in other parts of this disclosure and constrained by the initial input. A jewelry-specific model would consider factors such as material durability, gemstone cut, and popular design trends.

At 1206, the system configures a prompt instruction as an input to the selected model based on the user input. For example, the system can generate a textual prompt that is input to the selected model, including the attributes or conditions specified in the initial input. This prompt could look like "generate a gift for my daughter within a $100-$200 price range."

At 1208, the system generates, based on the prompt instruction and processing by the selected model, one or more images representing different synthetic products that meet the requirements of the initial input for a conceptual product. For example, the images of the synthetic products meet the physical attribute requirements and/or the specified price range. The generated images might showcase different designs of different pieces of jewelry with varying styles, ensuring all options fall within the user's price range.

At 1210, the system can receive user feedback on images of the conceptual product or additional input data. This feedback helps improve model accuracy and refine the product images by incorporating it into a prompt instruction. The system may also use a quality assurance algorithm to evaluate image reliability, design quality, and defects. The models can also be trained based on these assessments.

Figure 13:
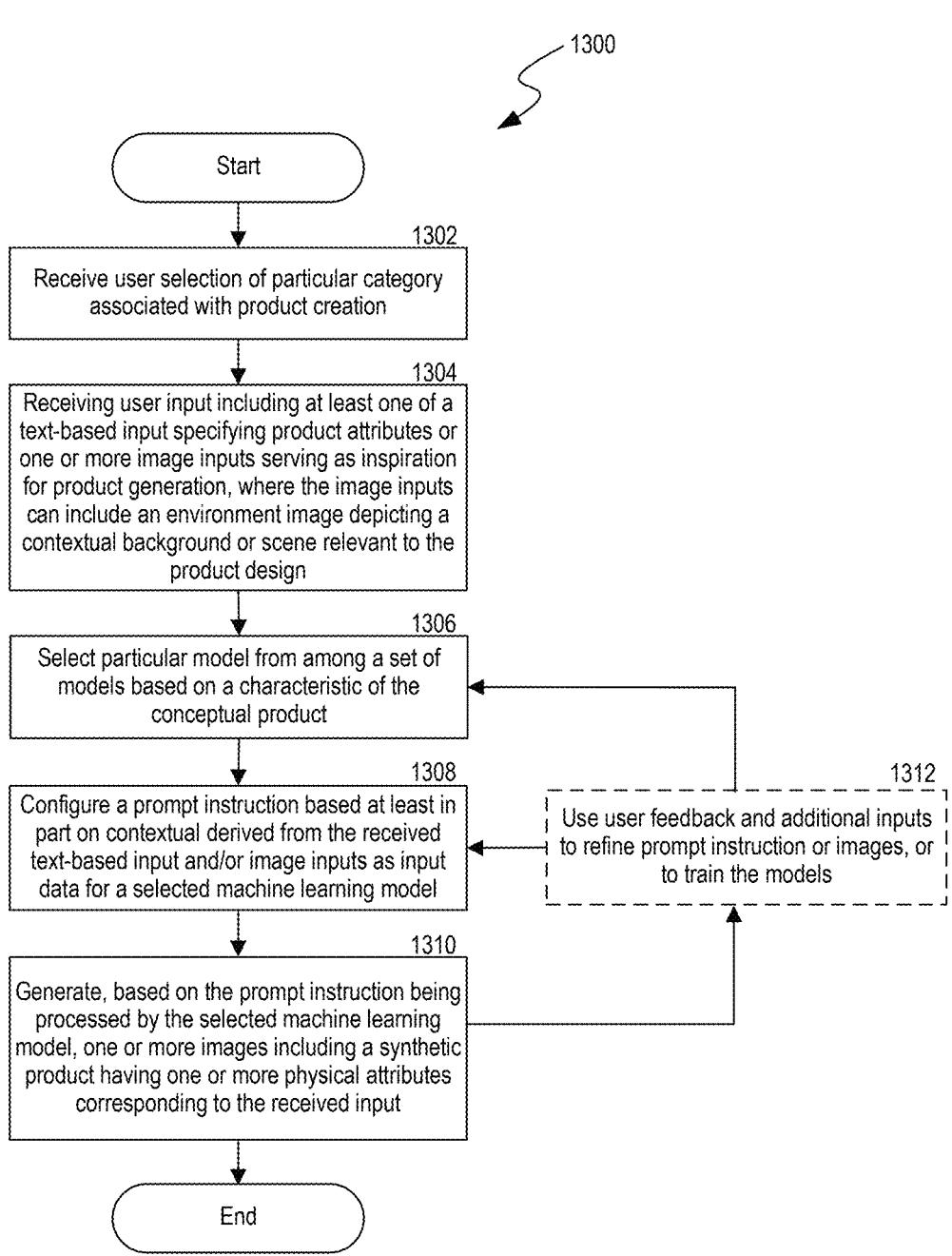
FIG. 13 is a flowchart that illustrates a process to generate images of conceptual products based in part on contextual information that is derived from user input.

FIG. 13 is a flowchart that illustrates a process 1300 to generate images of conceptual products based in part on contextual information that is derived from user input. Examples of the user input include media (e.g., images, video, audio) or text where the contextual information does not explicitly specify attributes of a conceptual product. For instance, a user can upload an image of an environment, scene, or object accompanied by a textual detail about a desired product. The media is processed to extract the contextual information that is used to augment a prompt instruction to inspire the product design.

In one example, the user uploads an image of an outfit, and the system generates earrings that complement the outfit. In another example, a user uploads an image of a room and an indication of a desired rug for the room. The system then produces images of rugs that suit the space, considering physical constraints and existing décor. Thus, a conceptual rug is created to match modern, traditional, or minimalist décor and incorporates attributes based on lighting or décor present in the room. The generation of images can also extend to other product categories mentioned herein. For instance, users could provide images of their gardens, and the system might suggest suitable garden furniture or plant arrangements based on the theme or style inferred from the image.

At 1302, the system receives user input including an indication of the user's selection of a product category. For example, the user can select home décor generally or rugs more specifically. Alternatively, the user can choose personal décor generally or jewelry more specifically. In one example, the user can select a product category from a menu of options presented on a user interface. The user interface might include a dropdown menu, voice command capability, or even gesture-based selections using a connected device.

At 1304, the system receives user input that includes media such as an image, video, or audio file, along with optional text-based input specifying product attributes. This media provides the contextual information used for product design. For instance, the system can process the media to extract features used to generate contextual descriptions. Recognized objects in the media might include furniture in a room or articles of clothing on a person. Additionally, the system can identify features such as types of furniture décor (e.g., modern, traditional, minimalist) or types of personal décor (e.g., active, casual, business casual). The system can also extract non-object-related features, such as lighting in an image or background sounds in an audio recording. These extracted features are utilized as contextual information for product design. Optional text-based input might specify product features like a "matching rug for underneath a coffee table" or a "colorful belt for a business suit." Therefore, media input serves as inspiration for product generation, where the media file depicts a relevant contextual background or scene.

At 1306, the system selects a specific model from a set of models based on a characteristic of the conceptual product. This characteristic can include the product category such as home décor or, more specifically, furniture, rugs, or window treatments. Models trained for characteristics can be selected. Additionally, the characteristic might include a particular cultural or regional aesthetic that can be used to generate images of synthetic products aligned with that aesthetic. For instance, the system might use a style transfer model to apply the artistic styles of specific cultures to generated products.

At 1308, the system configures a prompt instruction based on the product category, the received media inputs, and the optional text-based input for a selected machine learning model. For instance, the system can generate a prompt instruction expressing inspiration for a product design based on user-specified attributes or conditions, as well as contextual information extracted from media inputs. The recognized objects and their attributes, combined with optional text-based input, are used to create the prompt instruction.

At 1310, utilizing the configured input data (e.g., prompt instruction) processed by the selected model, the system generates one or more images depicting a synthetic product that represents a conceptual product, based on the inputs including the contextual information. For example, images of rugs that align with the aesthetic of a room are presented as products available for immediate purchase. Similarly, images of jewelry matching an outfit in a user-provided picture are displayed for purchase.

At 1312, the system can receive user feedback on images of the conceptual product or additional input data. This feedback helps improve model accuracy and refine the product images by incorporating it into a prompt instruction. The system may also use a quality assurance algorithm to evaluate image reliability, design quality, and defects. The models can also be trained based on these assessments.

Remarks

The terms "example," "embodiment," and "implementation" are used interchangeably. For example, references to "one example" or "an example" in the disclosure can be, but not necessarily are, references to the same implementation; and such references mean at least one of the implementations. The appearances of the phrase "in one example" are not necessarily all referring to the same example, nor are separate or alternative examples mutually exclusive of other examples. A feature, structure, or characteristic described in connection with an example can be included in another example of the disclosure. Moreover, various features are described that can be exhibited by some examples and not by others. Similarly, various requirements are described that can be requirements for some examples but not for other examples.

The terminology used herein should be interpreted in its broadest reasonable manner, even though it is being used in conjunction with certain specific examples of the invention. The terms used in the disclosure generally have their ordinary meanings in the relevant technical art, within the context of the disclosure, and in the specific context where each term is used. A recital of alternative language or synonyms does not exclude the use of other synonyms. Special significance should not be placed upon whether or not a term is elaborated or discussed herein. The use of highlighting has no influence on the scope and meaning of a term. Further, it will be appreciated that the same thing can be said in more than one way.

Unless the context clearly requires otherwise, throughout the description and the claims, the words "comprise," "comprising," and the like are to be construed in an inclusive sense, as opposed to an exclusive or exhaustive sense—that is to say, in the sense of "including, but not limited to." As used herein, the terms "connected," "coupled," and any variants thereof mean any connection or coupling, either direct or indirect, between two or more elements; the coupling or connection between the elements can be physical, logical, or a combination thereof. Additionally, the words "herein," "above," "below," and words of similar import can refer to this application as a whole and not to any particular portions of this application. Where context permits, words in the above Detailed Description using the singular or plural number may also include the plural or singular number, respectively. The word "or" in reference to a list of two or more items covers all of the following interpretations of the word: any of the items in the list, all of the items in the list, and any combination of the items in the list. The term "module" refers broadly to software components, firmware components, and/or hardware components.

While specific examples of technology are described above for illustrative purposes, various equivalent modifications are possible within the scope of the invention, as those skilled in the relevant art will recognize. For example, while processes or blocks are presented in a given order, alternative implementations can perform routines having steps, or employ systems having blocks, in a different order, and some processes or blocks may be deleted, moved, added, subdivided, combined, and/or modified to provide alternative or sub-combinations. Each of these processes or blocks can be implemented in a variety of different ways. Also, while processes or blocks are at times shown as being performed in series, these processes or blocks can instead be performed or implemented in parallel, or can be performed at different times. Further, any specific numbers noted herein are only examples such that alternative implementations can employ differing values or ranges.

Details of the disclosed implementations can vary considerably in specific implementations while still being encompassed by the disclosed teachings. As noted above, particular terminology used when describing features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed herein, unless the above Detailed Description explicitly defines such terms. Accordingly, the actual scope of the invention encompasses not only the disclosed examples but also all equivalent ways of practicing or implementing the invention under the claims. Some alternative implementations can include additional elements to those implementations described above or include fewer elements.

Any patents and applications and other references noted above, and any that may be listed in accompanying filing papers, are incorporated herein by reference in their entireties, except for any subject matter disclaimers or disavowals, and except to the extent that the incorporated material is inconsistent with the express disclosure herein, in which case the language in this disclosure controls. Aspects of the invention can be modified to employ the systems, functions, and concepts of the various references described above to provide yet further implementations of the invention.

To reduce the number of claims, certain implementations are presented below in certain claim forms, but the applicant contemplates various aspects of an invention in other forms. For example, aspects of a claim can be recited in a means-plus-function form or in other forms, such as being embodied in a computer-readable medium. A claim intended to be interpreted as a means-plus-function claim will use the words "means for." However, the use of the term "for" in any other context is not intended to invoke a similar interpretation. The applicant reserves the right to pursue such additional claim forms either in this application or in a continuing application.

We claim:

1. A computer-implemented method for predicting or estimating physical attributes of a product shown in an image, the method comprising:

receiving, by at least one hardware processor, one or more images of the product, wherein the one or more images reflect a version of the product with real-world materials, dimensions, and manufacturability limits, processing, by the at least one hardware processor, the one or more images using one or more machine learning (ML) models trained to detect physical characteristics and measure physical attributes of conceptual and real-world products shown in images, wherein the physical characteristics are distinguishable features of conceptual or real-world products shown in images, and wherein each of the one or more images are of the product with multiple physical attributes; and predicting or estimating, using the one or more ML models, measures of the multiple physical attributes of the product shown in the one or more images, wherein the one or more ML models are configured to predict measures of physical attributes of conceptual products that do not exist in the real world and estimate measures of physical attributes of real-world products, and wherein the prediction or estimation of the measures of the physical attributes includes measures for volume, weight, and dimensions of at least a portion of the product; and configuring a manufacturing process to produce a purchasable, physical product based on the measures of the physical attributes of the product shown in the one or more images.

2. The method of claim 1, wherein the product is a conceptual product, and wherein the method further comprises, prior to receiving the one or more images of the conceptual product:

receiving user input including a description of the conceptual product entered to a user interface of a user device; and generating the one or more images of the conceptual product as an output of a generative model based on a prompt input including the description of the conceptual product, wherein the product shown in the one or more images is manufacturable into the purchasable, physical product, and wherein the measures of the multiple physical attributes of the conceptual product shown in the one or more images are predicted by the one or more ML models.

3. The method of claim 1, further comprising, prior to receiving the one or more images of the product:

receiving user input including one or more photographs uploaded via a user interface, wherein the product shown in the one or more images is a real-world product shown in the one or more photographs, and wherein the measures of the multiple physical attributes of the real-world product shown in the one or more photographs are estimated by the one or more ML models.

4. The method of claim 1, wherein processing the one or more images using the one or more ML models comprises:

processing different images of the conceptual product showing different physical attributes of the product.

5. The method of claim 1, further comprising:

training the one or more ML models using a dataset including real-world photographs and images of synthetic products with known physical characteristics of a category of products, wherein the product belongs to the category of products.

6. The method of claim 1, further comprising:

generating, using a generative model, a natural language description of the predicted or estimated measures of the physical attributes of the product; and causing a display of a user device to present the natural language description of the predicted or estimated measures of the physical attributes of the product including measures for the volume, the weight, and the dimensions of the conceptual product.

7. The method of claim 1, further comprising, prior to predicting or estimating the physical attributes of the product:

identifying a product category for the product based on the detected physical characteristics of the product; and selecting the one or more ML models from among multiple ML models configured to predict or estimate physical attributes for different product categories, wherein the one or more selected ML models are configured to predict or estimate physical attributes of products in the product category.

8. The method of claim 1, further comprising:

receiving user feedback regarding predicted or estimated product attributes of the product; and incorporating the user feedback into a training dataset configured to improve accuracy of the one or more ML models in predicting or estimating physical attributes of products shown in images.

9. A non-transitory, computer-readable storage medium comprising instructions recorded thereon, wherein the instructions, when executed by at least one data processor of a system, cause the system to:

process one or more images using an artificial intelligence system configured to detect physical characteristics and physical attributes of products shown in images, wherein the one or more images reflect a version of the product with real-world materials, dimensions, and manufacturability limits that are manufacturable into physical products, wherein the artificial intelligence system includes one or more models that are trained on images of products with multiple or different physical attributes to detect physical characteristics and measure physical attributes of conceptual products that do not yet exist and real-world products shown in images;

predict or estimate, by the artificial intelligence system, one or more physical attributes of the product shown in the one or more images, wherein the artificial intelligence system predicts the physical attributes of the product including measures for volume, weight, and dimensions; and configure a manufacturing process to produce a purchasable, physical product based on the measures of the physical attributes of the product in the one or more images.

10. The non-transitory, computer-readable storage medium of claim 9, wherein the one or more images are of the product having different physical attributes.

11. The non-transitory, computer-readable storage medium of claim 9, wherein the product is a conceptual product, and wherein the system is further caused to, prior to the one or more images being processed using an artificial intelligence system:

receive user input including a text-based description of the conceptual product entered at a user interface of a user device; and generate the one or more images as an output of a generative model based on a prompt input including the text-based description of the conceptual product, wherein the product shown in the one or more images is the conceptual product that does not exist and is manufacturable into a physical product.

12. The non-transitory, computer-readable storage medium of claim 9, wherein the one or more images that show the product are photographs of real-world products.

13. The non-transitory, computer-readable storage medium of claim 9, wherein the system is further caused to:

train a model of the artificial intelligence system using a dataset comprising real-world images and synthetic images of products with known physical attributes.

14. The non-transitory, computer-readable storage medium of claim 9, wherein the product is a conceptual product, and wherein the system is further caused to:

generate, using a generative model, a natural language description of the predicted physical attributes of at least a portion of the conceptual product; and cause a user device to present the natural language description of the predicted physical attributes of at least the portion of the conceptual product including measures for the volume, the weight, and the dimensions.

15. The non-transitory, computer-readable storage medium of claim 9, wherein the product is a conceptual product, and wherein the system is further caused to, prior to the physical attributes of the conceptual product being predicted or estimated:

identify a product category of the conceptual product based on the detected physical characteristics of the product; and select a machine learning (ML) model from among multiple ML models configured to predict physical attributes of different product categories, wherein the selected ML model is configured to predict physical attributes of products in the product category.

16. The non-transitory, computer-readable storage medium of claim 9, wherein the product is a conceptual product, and wherein the system is further caused to:

incorporate user feedback into a training dataset configured to improve accuracy of one or more models of the artificial intelligence system in predicting physical attributes of conceptual products.

17. A system comprising:

at least one hardware processor; and at least one non-transitory memory storing instructions, which, when executed by the at least one hardware processor, cause the system to:

process one or more images using a machine learning (ML) model trained to predict or estimate physical attributes of conceptual products or real-world products shown in images, wherein the one or more images reflect a version of a conceptual product with real-world materials, dimensions, and manufacturability limits, wherein the conceptual product does not exist in the real-world and is manufacturable into a purchasable, physical product, wherein the ML model is trained on images of products with multiple or different physical attributes;

determine, by the ML model, measures of physical attributes of the conceptual product shown in the one or more images, wherein the measures of physical attributes include volume, weight, or dimensions of the conceptual product; and generate product data for producing the purchasable, physical product based on the measures of the physical attributes of the conceptual product.

18. The system of claim 17, wherein the conceptual product is rendered as a computer-generated synthetic product in the one or more images, and wherein to determine the physical attributes of the synthetic product comprises further causing the system to:

predict the physical attributes of a real-world product that represents the synthetic product shown in the one or more images.

19. The system of claim 17, wherein the conceptual product represents a real-world product, and wherein to determine the physical attributes of the real-world product comprises causing the system to:

estimate the physical attributes of a real-world product shown in one or more photographs.

20. The system of claim 17, wherein the system is further caused to:

train the ML model using a dataset comprising real-world images and images of synthetic products with known physical characteristics.

* * * * *